United States Patent
Bowler et al.

(10) Patent No.: US 11,641,239 B2
(45) Date of Patent: May 2, 2023

(54) METHODS AND SYSTEMS FOR LAUNCHING TRANVERSE MAGNETIC WAVES USING DATA-CARRYING ARRESTOR

(71) Applicant: ARRIS Enterprises LLC, Suwanee, GA (US)

(72) Inventors: David B. Bowler, Doylestown, PA (US); Shaoting Gu, Acton, MA (US); Xinfa Ma, Acton, MA (US); Clarke V. Greene, Middletown, CT (US); David Grubb, III, Doylestown, PA (US); Samuel Francois, Boston, MA (US); Lawrence M. Hrivnak, Lowell, MA (US); Bruce C. Pratt, Bedford, NH (US); Theodore A. Colarusso, Madbury, NH (US); Thomas F. Kister, Chalfont, PA (US); Robert Noonan, Wauconda, IL (US); Vincent T. Lucarini, North Andover, MA (US); David F. Hubbell, Stratham, NH (US)

(73) Assignee: ARRIS Enterprises LLC, Suwanee, GA (US)

( * ) Notice: Subject to any disclaimer, the term of this patent is extended or adjusted under 35 U.S.C. 154(b) by 9 days.

(21) Appl. No.: 17/355,840

(22) Filed: Jun. 23, 2021

(65) Prior Publication Data

US 2021/0391924 A1 Dec. 16, 2021

Related U.S. Application Data

(63) Continuation of application No. 16/813,384, filed on Mar. 9, 2020, now Pat. No. 11,050,490.

(Continued)

(51) Int. Cl.
*H04L 25/00* (2006.01)
*H04B 10/2575* (2013.01)
(Continued)

(52) U.S. Cl.
CPC ..... *H04B 10/25751* (2013.01); *G02B 6/4279* (2013.01); *H01C 7/12* (2013.01);
(Continued)

(58) Field of Classification Search
CPC ...... H04B 3/00; H04B 10/57751; H04B 3/04; H04L 25/0272; H04L 25/0292; H04L 25/08; G02B 6/4279; H02H 9/044
(Continued)

(56) References Cited

U.S. PATENT DOCUMENTS

| 2,736,863 A | 2/1956 | Mfred et al. | |
|---|---|---|---|
| 2009/0002094 A1* | 1/2009 | Radtke | H04B 3/56 333/132 |

(Continued)

FOREIGN PATENT DOCUMENTS

RU 2144720 C1 1/2000

OTHER PUBLICATIONS

International Search Report and Written Opinion RE: Application No. PCT/US2020/021753.

*Primary Examiner* — Khai Tran
(74) *Attorney, Agent, or Firm* — Chernoff, Vilhauer, McClung & Stenzel, LLP

(57) ABSTRACT

Methods and systems capable of launching signal-carrying transverse electromagnetic waves onto a transmission line in the higher voltage region of the transmission distribution network. Such methods and systems may include a surface wave launcher located in the higher voltage region, a network unit located in a lower voltage region, and an arrester separating the surface wave launcher and the network unit, (Continued)

the arrester preventing voltage from arcing over from the higher voltage region to the lower voltage region where the arrester provides the signal to the surface wave launcher.

16 Claims, 24 Drawing Sheets

Related U.S. Application Data

(60) Provisional application No. 62/815,072, filed on Mar. 7, 2019.

(51) Int. Cl.
| | |
|---|---|
| *G02B 6/42* | (2006.01) |
| *H04N 21/61* | (2011.01) |
| *H04B 3/54* | (2006.01) |
| *H04B 7/01* | (2006.01) |
| *H04B 7/06* | (2006.01) |
| *H01C 7/12* | (2006.01) |
| *H01P 3/06* | (2006.01) |
| *H01P 5/08* | (2006.01) |
| *H02H 9/04* | (2006.01) |
| *H03H 5/02* | (2006.01) |
| *H05K 9/00* | (2006.01) |
| *H04B 1/44* | (2006.01) |
| *H04B 3/04* | (2006.01) |

(52) U.S. Cl.
CPC ............... *H01P 3/06* (2013.01); *H01P 5/08* (2013.01); *H02H 9/044* (2013.01); *H03H 5/02* (2013.01); *H04B 1/44* (2013.01); *H04B 3/04* (2013.01); *H04B 3/54* (2013.01); *H04B 7/01* (2013.01); *H04B 7/0613* (2013.01); *H04B 10/25752* (2013.01); *H04N 21/6168* (2013.01); *H05K 9/006* (2013.01)

(58) Field of Classification Search
USPC .......................................................... 375/257
See application file for complete search history.

(56) References Cited

U.S. PATENT DOCUMENTS

| | | | |
|---|---|---|---|
| 2009/0146666 A1 | 6/2009 | Ohtsuka et al. | |
| 2011/0187578 A1* | 8/2011 | Farneth | G01S 13/04 |
| | | | 342/27 |
| 2018/0108997 A1* | 4/2018 | Henry | H01Q 1/50 |
| 2019/0113561 A1 | 4/2019 | Yogeeswaran | |
| 2022/0005633 A1* | 1/2022 | Cao | H03H 7/06 |

* cited by examiner

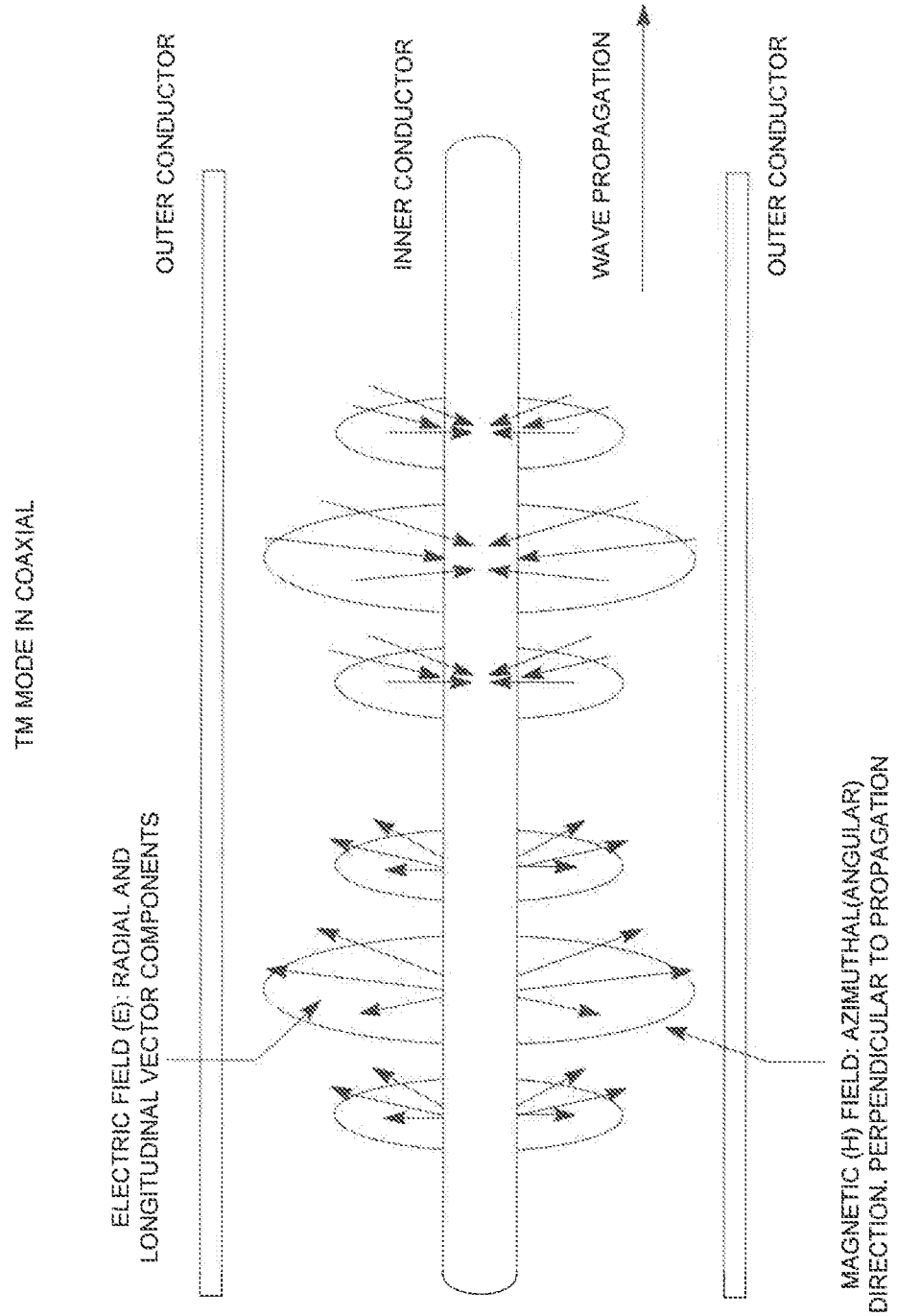

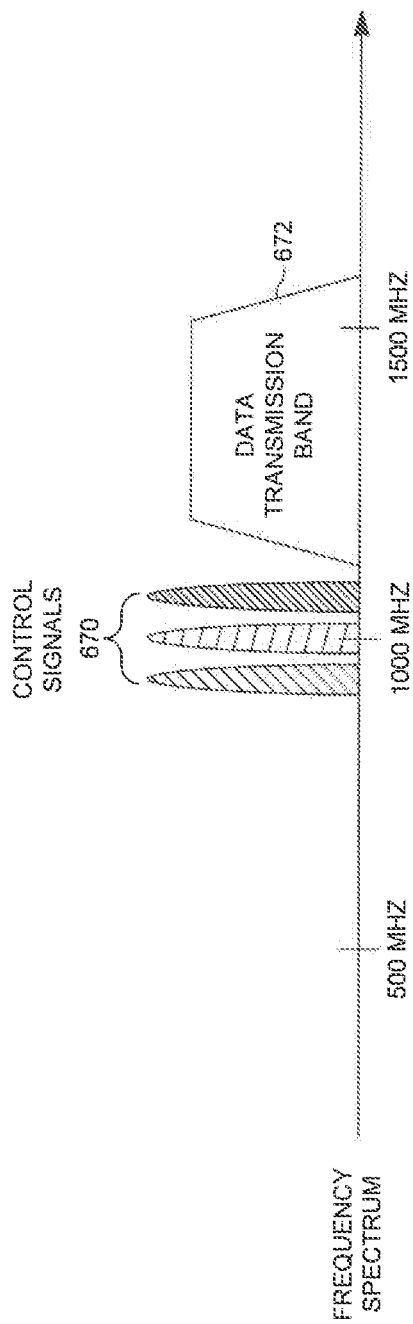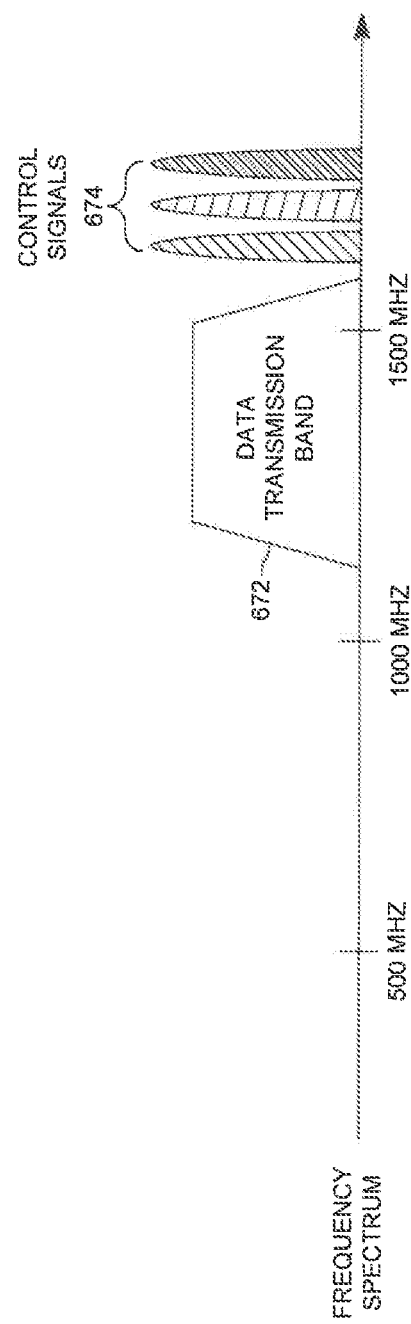

METHODS AND SYSTEMS FOR LAUNCHING TRANVERSE MAGNETIC WAVES USING DATA-CARRYING ARRESTOR

CROSS REFERENCE TO RELATED APPLICATIONS

This application is a continuation of U.S. patent application Ser. No. 16/813,384 filed Mar. 9, 2020, which claims the benefit of priority under 35 U.S.C. § 119(e) to provisional application Ser. No. 62/815,072 filed on Mar. 7, 2019, the contents of both incorporated by reference herein.

BACKGROUND

Systems and methods that communicate radio frequency (RF) signals from one location to another have historically used one of two alternative methods of electromagnetic wave propagation. First, RF signals may be propagated over a wired connection, such as a coaxial cable, an optical cable, etc. Such wired systems are used not only to communicate signals over short distances, such as audio or video signals communicated between components of stereo or other electronic equipment in close proximity to each other, but also to communicate over very large distances, such as the delivery of cable television and/or Internet content as well as telephone or other data services to large groups of customers. In this latter instance, telephone or cable television (CATV) networks often provide the architecture for a multitude of wired communications services used by both residential and business customers in the area, e.g. Internet, Voice-over-IP, Video on Demand, etc. Because fiber optical systems are capable of much greater bandwidth than legacy copper coaxial wiring, while also transmitting over longer distances, most wired telecommunications networks today have replaced at least a portion of the historical coaxial copper network with fiber-optic equipment.

Second, electromagnetic waves may be propagated wirelessly from a transmitting antenna to a receiving antenna, and these waves may be modulated to communicate a desired signal. Wireless RF communication is used in many applications, including AM/FM radio broadcasting, satellite broadcasting, television broadcasting, cell phone communication, radar systems, computer and mobile platform networks, remote control of devices, remote metering/monitoring, and many more such applications. While extraordinarily useful in such applications, many impediments exist to further expansion of wireless communications technologies. For example, wireless signals are subject to mutual interference, and as wireless transmission has become more ubiquitous, potential interference must be addressed with a combination of sophisticated signal processing techniques that add to the complexity of wireless communication systems. Moreover, when power is radiated from an antenna, very little of it typically reaches the receiver—a phenomenon known as path loss—which is countered at the expense of increased transmit power, specialized antennas, and other burdensome solutions.

In order to accommodate growing demand for wireless services, where consumers desire mobile access to bandwidth-intensive services such as video and high-speed Internet, wireless network providers have built out small cell networks that are in turn connected to wired RF communications networks that deliver content to and from the Internet over fiber optic/coaxial lines. In this architecture, the mobile client communicates with a network of cell towers, each of which in turn communicate with a wired communications architecture, such as a Hybrid Fiber Coaxial (HFC) network of a cable television (CATV) provider. This latter exchange is typically referred to as the "backhaul" portion of a cellular communications network.

Still, consumer data usage is increasing at rates that are overwhelming microcell base stations and existing wireless infrastructures, creating a bottleneck of traffic as it exchanged with the backhaul portion of the network. Though this bottleneck may in some instances be alleviated by expanding wireless infrastructures, in many geographic regions installing communications infrastructure is prohibitive due to low population density and topographical barriers. Thus, improved systems and methods for transmitting data services to consumers is desired.

BRIEF DESCRIPTION OF THE DRAWINGS

FIG. 2F shows a TM mode signal propagating in a coaxial cable.

FIG. 6B shows exemplary control signals included at a lower frequency spectrum from the data transmission band.

FIG. 6C shows exemplary control signals included at a higher frequency spectrum from the data transmission band.

DETAILED DESCRIPTION

Described herein are systems and methods for transmitting data. In the following description, for purposes of explanation, numerous examples and specific details are set forth in order to provide a thorough understanding of some embodiments. Some embodiments as defined by the claims may include some or all of the features in these examples alone or in combination with other features described below and may further include modifications and equivalents of the features and concepts described herein.

Figure 1:
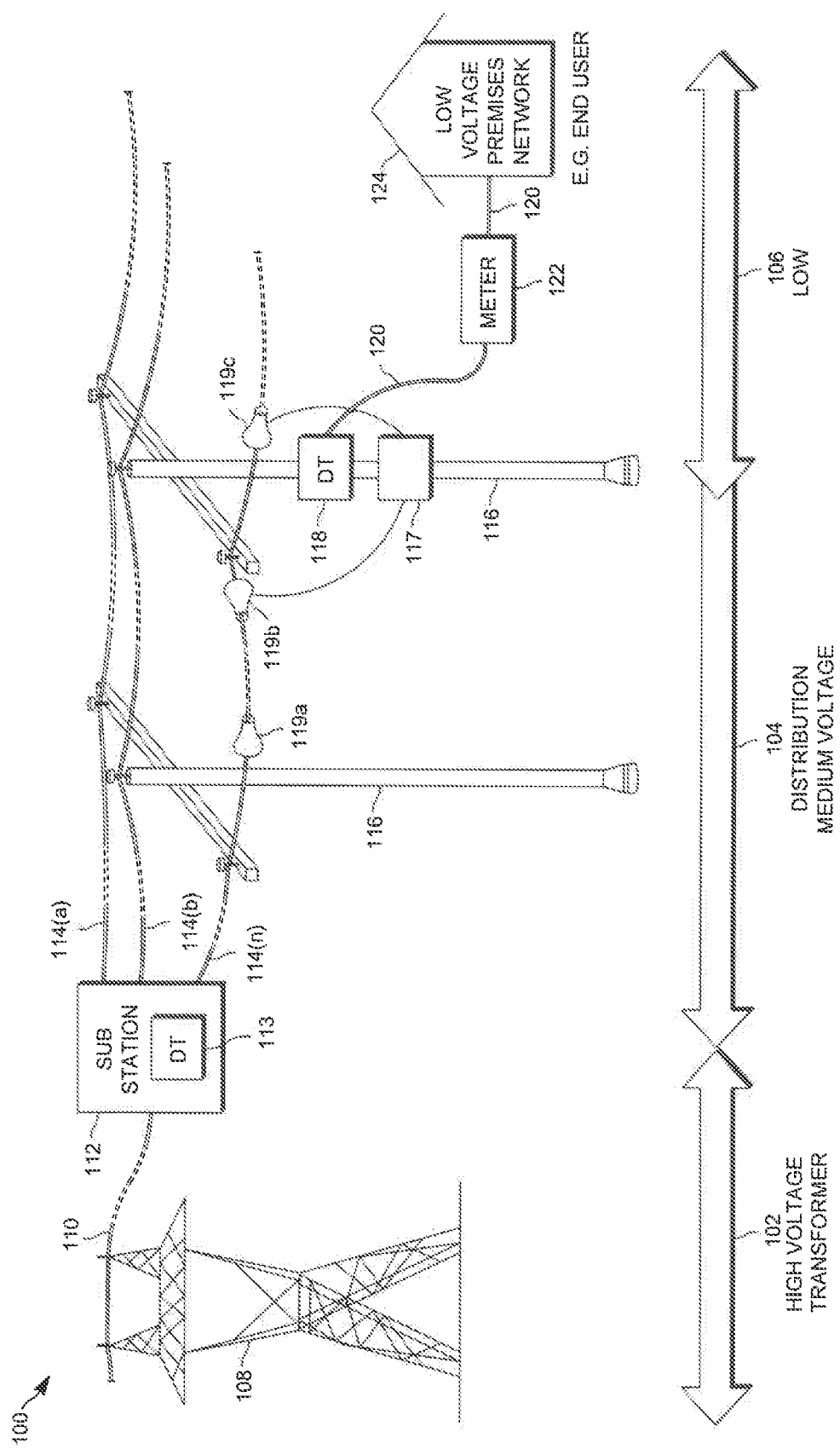
FIG. 1 shows transverse magnetic (TM) wave devices that may emit and receive data signals over the power lines.

FIG. 1 shows an exemplary power distribution system 100 that may include components for power generation, transmission, and delivery. The power distribution system 100 may include a high voltage segment 102, a distribution medium voltage segment 104, and a service low voltage segment 106. Some common components found in a power distribution system are shown by way of illustration in FIG. 1, including a high voltage transmission tower 108, high voltage power lines 110, substation 112 with substation distribution transformer (DT) 113, medium voltage power cables 114(a), 114(b) . . . 114(n), utility poles 116, local distribution transformer 118, transverse magnetic wave devices 119a, 119b, 119c, low voltage power lines 120, meter 122, and a low voltage premises network or end user 124.

As shown in FIG. 1, high voltage transmissions may originate from a power source such as high voltage transmission tower 108 for transmission over high voltage transmission lines 110. The power source 108 may distribute long distance transmission on high voltage transmission lines 110 to one or more substations 112 with substation transformers 113, which then each transmit over medium voltage power cables 114. Medium voltage power cables 114 may distribute electrical power to residential neighborhoods, commercial areas, industrial areas, or other areas where such power lines reach. The power distribution system 100 may use one or more local transformers 118 along utility poles 116 in the distribution medium voltage segment 104 to ultimately distribute power over low voltage power lines to end users 124.

Transformers 113, 118 are often referred to as step down transformers, because they "step down" the input voltage to some lower voltage. Transformers, therefore, provide voltage conversion for the power distribution system 100. For example, when power is carried from a substation distribution transformer 113 to a distribution transformer 118, power may first be converted for transmission from high voltage to medium voltage at the transform substation 113 for transmission over medium voltage power lines, and then converted at the distribution transformer 118 from medium voltage to low voltage for transmission over low voltage power lines 120 to the low voltage systems, which may include end users such as 124. Such power distribution system 100 may enable power to be carried from the distribution transformer 118 to the customer premises 124 via the one or more low voltage power lines 120. The local distribution transformers 118 typically feed anywhere from one to ten customer premises 124, depending upon the concentration of the customer premises 124 in a particular region. The local distribution transformers 118 may be distributed based on a number of customers to be serviced and may be installed in locations along the power distribution system, such as pole-top transformers located on a utility pole as shown in FIG. 1, pad-mounted transformers located on the ground, or transformers located under ground level.

Power distribution systems include numerous segments related to power at different voltages. In the United States, the power distribution may include an extra-high voltage segment (not shown) including system voltages in the range of 230 kV-1100 kV. The high voltage segment 102 may use power over the power lines in range of 69 kilovolts (kV) to 230 kV. The distribution medium voltage segment 104 distributes power in the range of 600V to 69 kV. The segments of the power distribution system 100 that are connected to the customers premises typically are service low voltage segments 106 having a voltage under 600 V between 100 volts (V) and 240V, depending on the system. It should be understood, however, that such ranges may vary by region/country, and disclosed herein are techniques that are operable over different ranges of voltage and different cable diameters. As disclosed, embodiments are described that are operable independent of the power or voltage on the power lines, including embodiments that are passive. Also described are embodiments that are designed to accommodate the power lines, e.g., using certain materials to avoid contact voltages and short circuits.

For simplicity, FIG. 1 does not depict all components in a power distribution system, but highlights certain components that may be used to implement a power line communication system. Thus, it should be understood that FIG. 1 does not include all components that enable a power distribution system or a power line communication system, as aspects of conventional power distribution and power line systems are known.

As described above, the transition from one segment to another typically is accomplished with a transformer. For example, the transition from the medium voltage segment to the low voltage segment of the power distribution system typically is accomplished with a distribution transformer 118, which converts the higher voltage of the medium voltage segment to the lower voltage of the lower voltage segment. In the service low voltage segment, the distribution transformer 118 may be connected to the low voltage premises 124 through a meter 122. As disclosed in more detail below, the distribution transformer may not be part of the transmission using the disclosed techniques, where the signal may bypass the distribution transformer. For example, referring to FIG. 1, the signal may travel along the power line, drop down through an amplifier, thereby bypassing the distribution transformer and passing from the left of transverse magnetic device 119b to the right of transverse magnetic device 119c through an amplifier or network box 117. It is possible that another transverse magnetic device 119 may be positioned in the low voltage segment, e.g., along low voltage line 119, for purposes of extending in the 110 V portion of the system. However, wireless communication is usually available in the low voltage segment for delivery of signals output from the transverse magnetic device 119 to a customer 124, such as via 5G or Wi-Fi technologies or the like.

Power distribution systems like power distribution system 100 exist throughout many geographic regions, which provide power to customers via power lines. With some modification, the infrastructure of the existing power distribution systems can be used to provide data communication in addition to power delivery, thereby forming a power line communication (PLC) system.

Power Line Communication (PLC) is a communication technology for carrying data on conductors typically used for electric power transmission, enabling data to be sent over existing power cables. In other words, existing power lines that already have been deployed to many homes and offices, can be used to carry data signals to and from the homes and offices. However, the standard PLC presents a two-wire solution, and it is not practically applicable to the medium voltage power line. In addition, standard PLC has a narrow band and a broadband scheme, only encompassing up to 250 MHz of bandwidth, i.e. standard PLC has limited bandwidth or data rate. In contrast, the systems and methods disclosed in the present application can support a very high date depending on the operating frequency range.

In this regard, FIG. 1 also illustrates repeated instances 119a to 119c of a transverse magnetic (TM) wave device 119 (shown enlarged in FIG. 2A) that may emit, receive, and relay data signals over the power lines, and embodiments for the TM device 119 are described in more detail below. Power line communication is also referred to as power line carrier, mains communication, power line telecommunications (PLT), and power line networking (PLN).

While the concept of communication using the power distribution system may seem straightforward, there are many technical problems that arise when using a power line communication system. For example, transformers used in power line systems may prevent propagation of a signal, and many power line systems are limited to a type and thickness of cable. Moreover, most existing installed overhead power lines are not designed for the purpose of high speed data communications and are very susceptible to radio interference, and the quality of the transmission power lines, including type, age, and number of joints, may have an impact on reliability for communicating data signals. Furthermore, there are concerns that a bi-directional communication system cannot be installed to the existing infrastructure and/or be installed without disrupting power to customers during or after installation. Additionally, federal regulations limit the amount of radiated energy of a power line communication system, which therefore limits the strength of the data signal that can be injected onto power lines (especially overhead power lines).

In one or more embodiments disclosed herein, communication techniques in a medium-voltage and low-voltage portion of the power distribution system are adapted to utilize the utility-owned infrastructure in the power distribution network to provide a reliable and affordable communications channel. The disclosed communication systems, devices, and methods may be used to effectively transform the power distribution system into a communication infrastructure. In one or more embodiments, PLC solutions are used to connect elements in power grids, which is particularly useful where no other reliable communication channel is available. In one or more embodiments disclosed herein, the data may be sent while the power cables are simultaneously used for electric power transmission or electric power distribution to customers. In one or more embodiments disclosed herein, data may be sent while the power cables are not energized, sending data signals regardless of whether the power lines are energized and distributing electrical power at the same time.

As disclosed in more detail below, the power line communication system may include a TM wave device 119 that emits a data transmission as a transverse magnetic wave guided by an outer surface of a transmission medium, e.g., the medium voltage power cables 114.

Figure 2A:
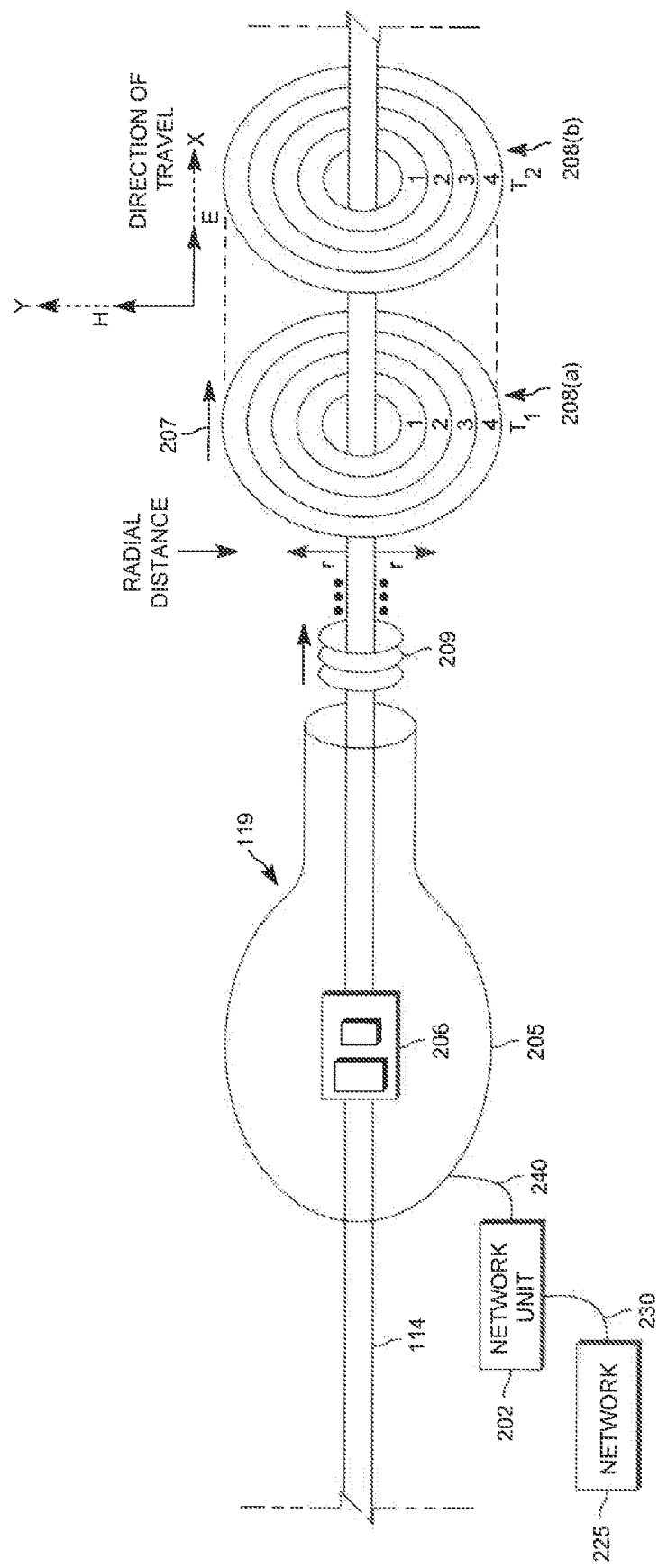
FIG. 2A shows an exemplary TM device in accordance with one or more embodiments of this disclosure.

FIG. 2A depicts an example transverse magnetic device 119 in accordance with one or more embodiments of this disclosure. The transverse magnetic device 119 may transmit, receive and/or relay signals and convert them into TM waves for propagation along a transmission medium, such as along the medium voltage power cable 114 also shown in FIG. 1. The device 119 is in communication with a network unit 202 via connection 240, which receives information from a data source. By way of example, FIG. 2A depicts receipt of information from a network 225 over connection 230, but those of ordinary skill in the art will appreciate that any source of information that can deliver the signals to a component in the disclosed transverse magnetic wave transmission system is applicable. Transmissions received and/or generated by the network unit 202 can be directed towards devices communicably coupled to the cable 114. For example, network unit 202 may provide data received over the network 225 in transmissions to the transceiver 119 for transmission over medium voltage power cable 114 using the transverse magnetic wave transceiver 206.

The network unit 202 may receive a signal over connection 230 from a network 225 and generate a transmission based on the signal and a carrier wave. The carrier wave can be modulated by the signal, and the resulting transmission can be delivered from the network unit 202 to the transceiver 119 via signal communication line 240. The communication between the network unit 202 may be based on existing transmission protocols and standards, such as MoCa and Wi-Fi standards. The signal communication line 240 may be a waveguide or transmission line that facilitates transportation of the millimeter-wave band transmission from the network unit 202 to the transceiver 119. The network connection 240 can be physical such as a fiber and/or cable, or wireless, such as Wi-Fi or 5G. For example, examples herein are described where the signal is in the form of an electromagnetic wave delivered through a coaxial connection 240.

FIG. 2A illustrates exemplary TM device 119 having an enclosure 205 and TM wave transceiver 206. As shown in FIG. 1, the TM wave transceiver 206 may be integrated with enclosure 205 for installing the TM device 119 along the medium voltage power cable 114 in a power distribution system 100. Generally, a transceiver is a device comprising both a transmitter and a receiver that are combined and share common circuitry or a single housing, such as enclosure 205. As described in more detail below, the TM wave transceiver 206 may function as a transmitter of surface waves and as a receiver of surface waves. In some embodiments, a surface wave is a signal that propagates along a surface, such as the surface of the power cable 114. As shown, the TM wave transceiver 206 may be positioned along a transmission medium 114 for transmission of surface-waves along the medium voltage power cable 114. As used herein, the surface-line conductor, power lines, transmission wires, wire, cables, and the like refer to the transmission medium over which the disclosed surface waves may propagate, such as power cables 114. The term waveguide as used herein may refer to a structure that conveys signals, including the transmission medium along which a surface wave propagates (on the surface, not inside).

Upon receipt of information via connection 240, the TM wave transceiver 206 may initiate signal energy onto a conductor in a surface-wave mode. Specifically, the TM wave transceiver 206 may facilitate surface wave propagation of a data signal along the cable 114 by emitting a magnetic wave that propagates longitudinally along the surface of the transmission medium, extending emission of millimeter-waves in the range of 20 GHz-300 GHz to surface communications in the 1 MHz to 1 THz range. As described in more detail below, transverse magnetic transmissions as disclosed herein extend the system from Megahertz to Terahertz. Prior systems did not account for radio frequency interference (RFI) considerations and the physical size of the devices, which increases in deficits below 1 GHz. The disclosed transceiver may have a high frequency range that is dependent on cable size. When frequency range increases, the transceiver dimension may decrease. But, as described herein, a transceiver design that is too small may decrease coupling efficiency if too small in relation to the cable size. Disclosed techniques contemplate the trade-offs to maximize efficiency.

The resulting transverse magnetic surface wave propagating along the transmission medium 114 (in contrast to signals confined within a transmission medium) has a magnetic field that is perpendicular to the longitudinal axis of the transmission medium, i.e., perpendicular to the direction of propagation. FIG. 2A depicts an electromagnetic wave 209 emitted from the TM wave transceiver 206 and propagating along the transmission medium 114, generating transverse magnetic field vector (H) external to the transmission medium, i.e., perpendicular, to the general forward direction of propagation 207. Thus, the TM wave transceiver 206 may emit a wave 209 guided by the surface of the conductor and traveling along cable 114 in a direction of propagation 207, where the wave 209 is represented at time T1 by a single instance of the magnetic field 208(a) that is generated as the signal propagates along the transmission medium 114, another instance of the magnetic field 208(b) shown at time T2.

In one or more embodiments, a specific transverse magnetic mode or modes of transmission that generates the magnetic field with a maximum strength at a certain distance away from the transmission medium provides for optimal transfer of the signal. In ideal conditions, the same magnetic field may be generated longitudinally at each distance from the cable as the signal travels in the direction of propagation to its destination.

Figure 2B:
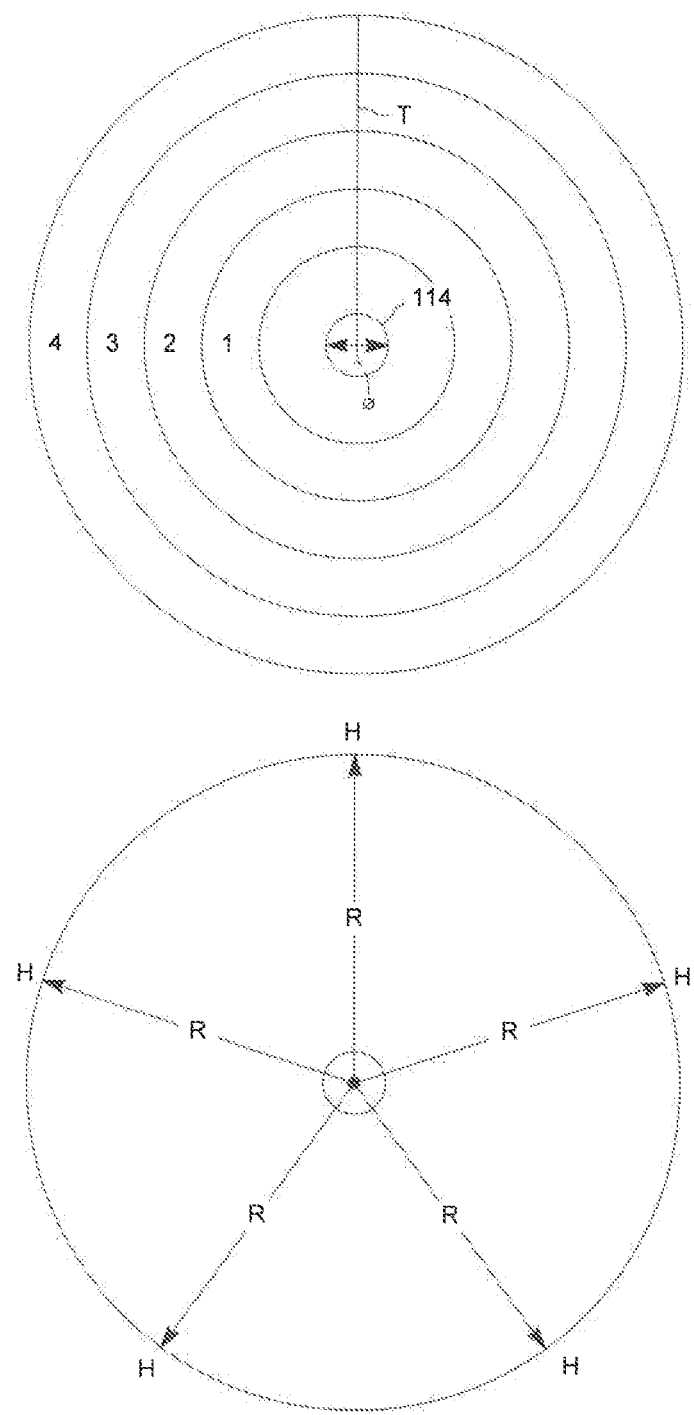
FIG. 2B shows a cross-section of a TM signal from a perspective looking into the bore of a transmission line or cable.

As shown in FIG. 2A, the signal 209 propagates longitudinally along the surface of the cable with the magnetic field surrounding the cable as it travels along the cable 114. This longitudinally-travelling TM wave, however, propagates with varying magnetic field strengths "H" existing at different distances from the surface of the transmission medium, i.e. the cable 114. FIG. 2B, for example, illustrates a cross-section of the signal shown when looking into the bore of cable 114, with the magnetic field strength in a direction perpendicular to the direction of propagation, as shown by the H vectors.

The transverse magnetic wave carrying data propagates longitudinally with varying magnetic field strengths existing at different distances from the surface of the transmission medium. By way of example, FIG. 2B depicts example signal strengths 1, 2, 3, and 4, each representing a range of signal strength as a function of the radial distance (r) of the magnetic field from the transmission medium. Thus, the signal 209 does not spiral around the cable 114 or curl around the cable in the same context as a signal that follows the right hand-rule and spirals through a cable. Rather, the magnetic field relates to a distance away from the cable and the curve that describes the magnetic field strength, as depicted in 2C, having a magnetic field strength that varies based on the radial distance from the transmission medium. For example, as shown by the instances 208a, 208b of the magnetic field in FIG. 2A at different times T1 and T2, the magnetic field represented by field strength 1 surrounds the cable at the same radial distance from the cable at T1 as T2.

Not all transverse magnetic modes generated by the TM transceiver 206 will persist in the field. The guided wave modes may be determined by the cable characteristics. For example, the relative strength of TM wave modes may depend on the transceiver design and relative geometry of transceiver and the cable. The structure of the modes in the guided TM wave mode 209 may be controlled by adjusting a relative amplitude and phase of power injected into the ports on the transceiver 119 or otherwise provided to the TM wave transceiver 206. As will be described herein, other factors may influence the modes that propagate along a surface-line conductor, particularly how and which modes are propagated along the transmission medium. Also, energy associated with the TM wave may be determined by a diameter and geometry of the conductor. Attenuation due to various factors of the operating environment may occur. For example, attenuation of the magnetic field surrounding the cable may occur due to a poor condition of the transmission medium, ineffective coupling of the signal to the transmission medium, an increasing distance from the transmission source, a poor performance of the transceiver, interference on the transmission medium, decreasing signal strength, availability of power, etc.

Disclosed herein are techniques for minimizing losses and facilitating a tighter coupling of the signal 209 to the transmission medium, which may thereby, among other things, improve performance, decrease the number of components required in the power line communication system, and decrease the needs for power. In one or more embodiments, a primary transmission mode (or modes) may be more effectively transmitted using the disclosed transceiver 206 having enclosure 205.

Figure 2C:
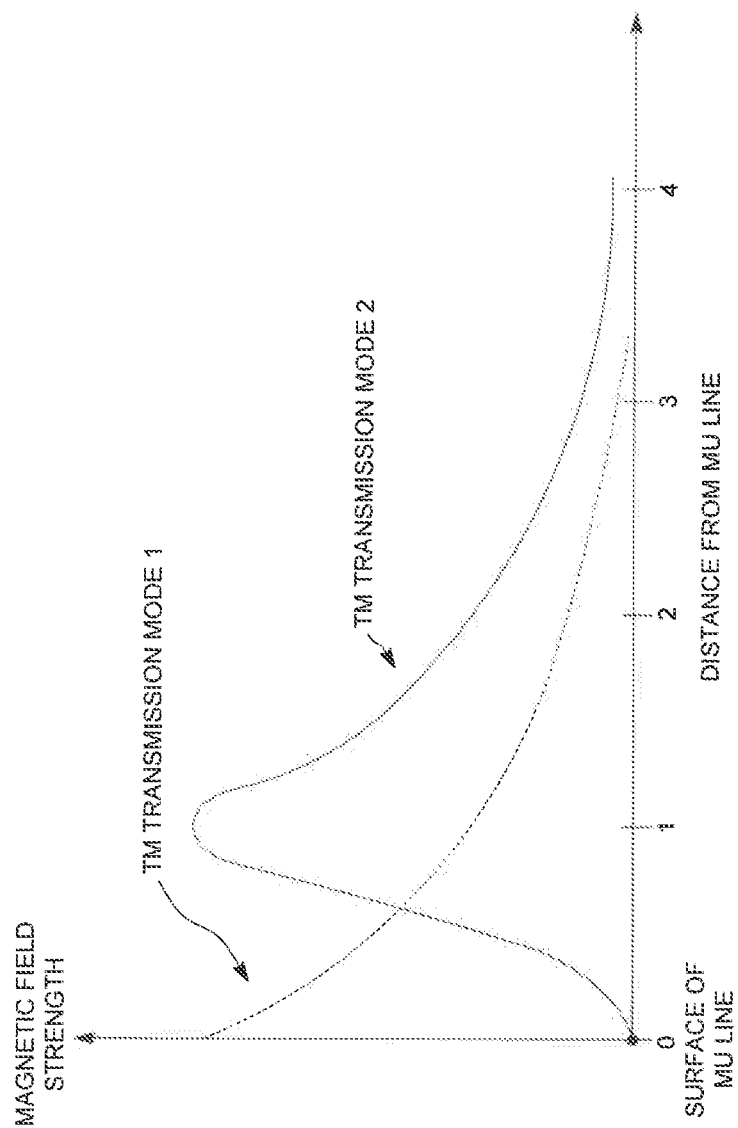
FIG. 2C shows a magnetic field strength around a transmission medium plotted against a distance from the outside of the transmission medium.

In the illustration of magnetic field strengths shown in FIG. 2B, there may be a transverse magnetic transmission mode where radius 0 has the strongest magnetic field strength, radius 1 has a lower magnetic field strength, radius 2 has an even lower magnetic field strength, so on and so forth. Alternatively, there may be a transverse magnetic transmission mode where radius 0 has a low magnetic field strength, radius 1 has a high magnetic field strength, radius 2 has a low magnetic field strength, radius 3 has an even lower magnetic field strength, etc. Thus, at a smaller radial distance from the wire, the magnetic field strength is lower than at an intermediate radial distance from the transmission medium 114, but at a distance greater than the intermediate radial distance the magnetic field strength decreases. FIG. 2C represents the magnetic field strength around a transmission medium plotted against the distance from the transmission medium, for each of the transverse magnetic transmission modes described above, where the starting point on the axis is the surface of the transmission medium and extends to a distance from the transmission medium at which distance the magnetic field is at a low or negligible strength or as attenuated and no longer exists. Reference is made herein to the Transverse Magnetic mode due to its transmission effectiveness over longer distances.

Transverse magnetic waves 209 emitted from the TM wave transceiver 206 are characterized by a magnetic strength vector (H) that is entirely perpendicular to the direction of propagation (i.e., transverse component) with the electric field (E) having a component parallel to the direction of propagation (i.e., the longitudinal component). This is in contrast to transverse electric (TE) waves, which have an electric field entirely perpendicular to the direction of propagation, as well as transverse electromagnetic (TEM) waves used within coaxial and open cable feeders, where TEM waves are characterized by both the electric field (E vector) and magnetic strength field (H vector) being entirely perpendicular to the direction of propagation with, neither in the direction of propagation.

Figure 2D:
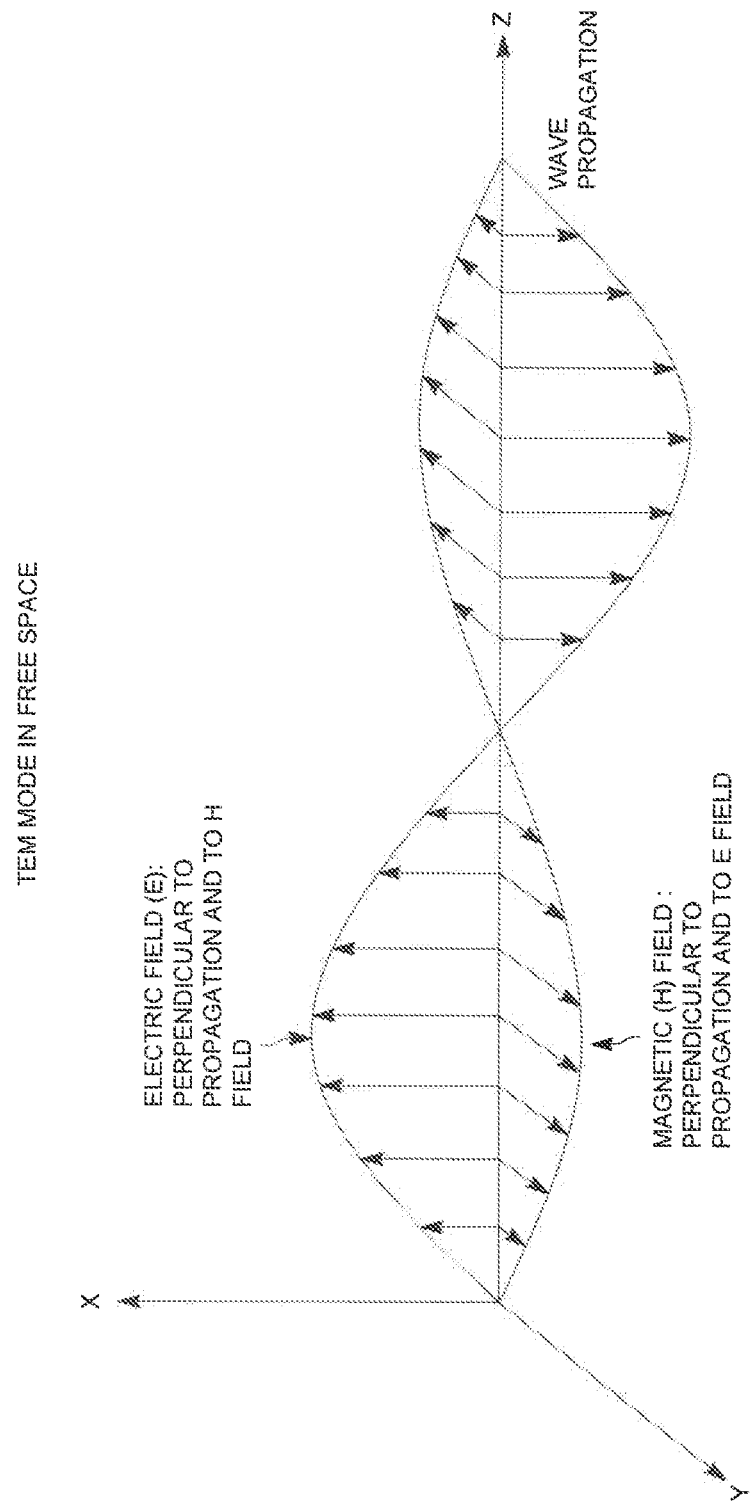
FIG. 2D shows a transverse electromagnetic (TEM) mode for a signal propagating in free space.
Figure 2E:
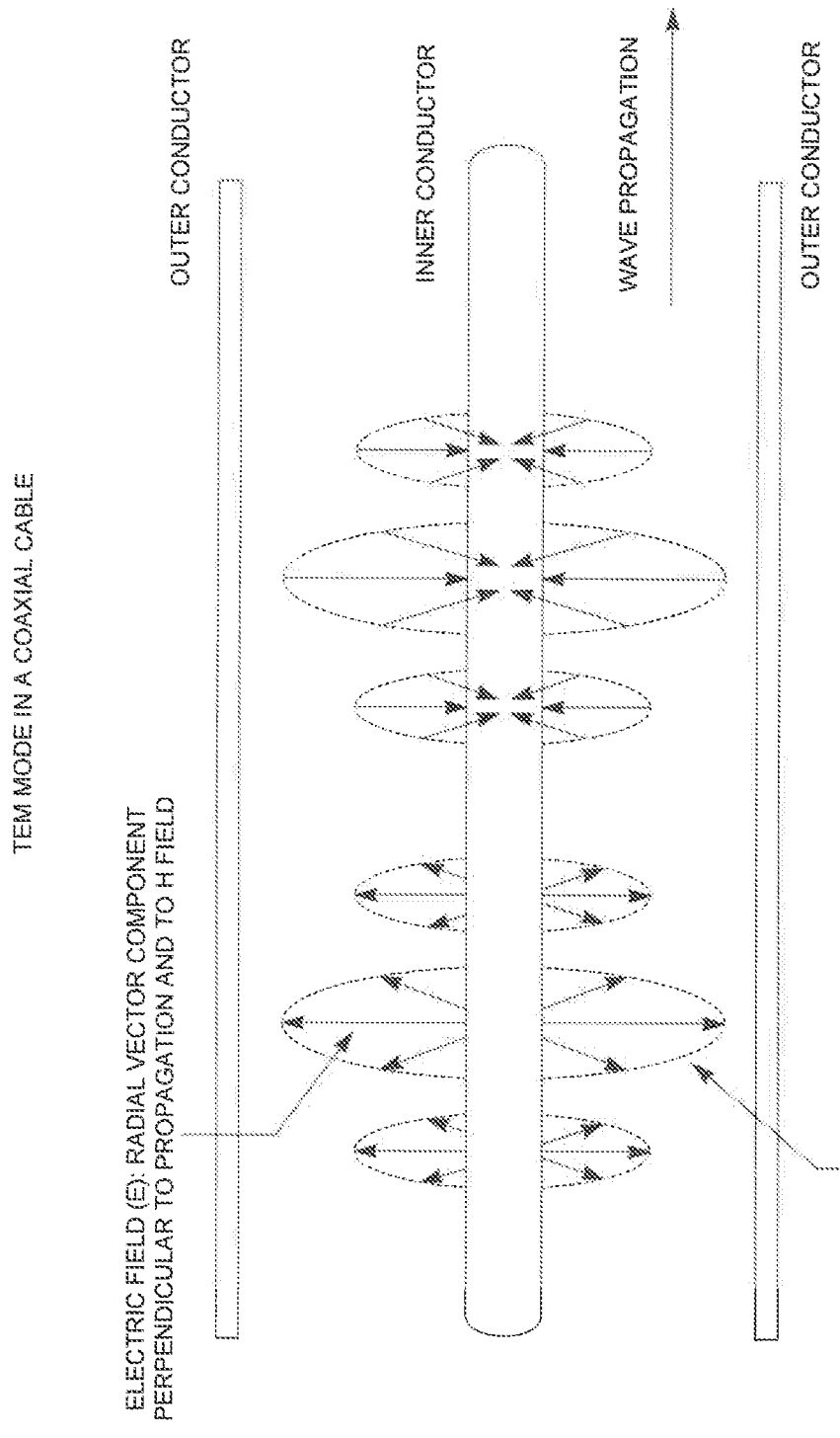
FIG. 2E shows a TEM mode for a signal propagating in a coaxial cable.
Figure 2G:
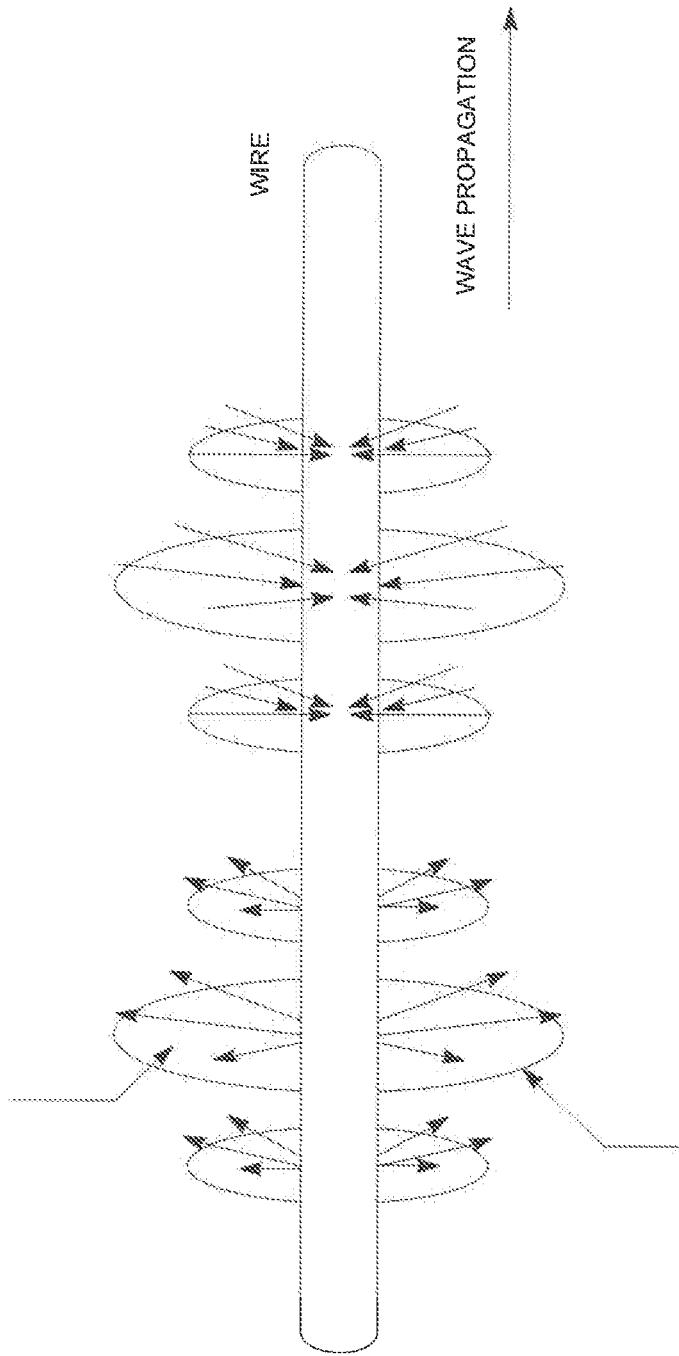
FIG. 2G shows a TM mode signal propagating as a guided wave along a single wire.

FIGS. 2D and 2E illustrate TEM propagation of a signal through free space and in a coaxial cable, respectively, while FIGS. 2F and 2G illustrate TM propagation of a signal through a coaxial cable and as a guided wave along a single wire, respectively. As described above, FIGS. 2D-2G depict the differences between a TEM mode where the electric field E and the magnetic strength field H are both always perpendicular to the direction of propagation, versus a TM mode where only the magnetic strength field (H) is always perpendicular to the direction of propagation. As shown in FIGS. 2D and 2E, for a TEM mode, the electric field E is perpendicular both to the direction of propagation and to the H field, and the magnetic field H is perpendicular both to the direction of propagation and to the E field. For a TEM mode in a coaxial cable, the electric field has a radial vector component perpendicular to propagation and to the H field, with the wave propagating between the outer conductors. The magnetic field exists in an azimuthal (angular) direction perpendicular to propagation and to the E field. However, TEM only stays TEM if it is presented with a uniform impedance across the wave front; if the impedance is not uniform, then the propagation delay varies across the front, causing the vectors to tilt. In the case of using a single wire as a waveguide, as is disclosed herein with use of a TM mode, the presence of the wire may cause a variation in impedance across the wavefront (unlike free space), which causes the vectors to tilt, which makes the wave no longer conform with the definition of TEM.

Figure 2H:
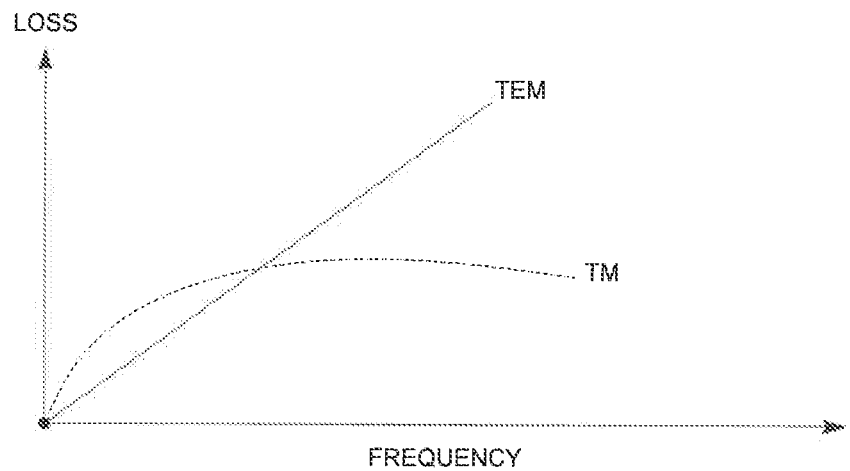
FIG. 2H shows energy loss as a function of frequency for both the TEM mode and the TM mode.

As shown in FIG. 2G, for a wave propagating in a TM mode within a coaxial cable between the outer conductor layers, the electrical field has radial and longitudinal vector components, while the magnetic field exists in the azimuthal (angular) direction perpendicular to propagation. FIG. 2H illustrates TM propagation of a guided wave along a single wire and how the electric field E and magnetic strength field H are similarly generated during wave propagation, where the electrical field has radial and longitudinal vector components, and the magnetic field exists in the azimuthal (angular) direction perpendicular to propagation.

It is notable that in the present embodiments, the TM wave transceiver 206 emits signals in one or more TM waves, in contrast to TEM waves occurring in a coaxial connection and having a return. Propagation of a TM wave produces a non-zero longitudinal component of the E-field, in contrast to TEM waves in coax, which produce only a transverse E-field. Thus, while many conventional systems may refer to use of a transmission medium or waveguide, the type of wave generated more particularly defines the nature of the transmission medium or waveguide.

In one or more embodiments disclosed herein, the transmission medium may be a single-wire transmission line, such as a single-line conductor, for transmitting guided surface waves, including electrical power or signals, using a single electrical conductor. TEM waves use a coaxial connection having a ground connection and a return current when a signal is transmitted, and generally require at least two conductors. In contrast, the single wire system used for transmitting TM waves does not require and/or include a return. As described in more detail below, a single-wire transmission line transmits electrical power or signals using a single electrical conductor in contrast to a pair of wires or multiple conductors. A single-wire transmission line differs from the use of the earth to effectively form a second conductor because there is no second conductor of any form in a single-wire transmission system.

Propagation of a TM wave produces a non-zero longitudinal component of the E-field, in contrast to TEM waves in coax, which produces a completely transverse E-field. Over a single-conductor transmission line, such as medium voltage power line 119, transverse magnetic modes (TM) may be excited by a displacement current. Thus, while TEM waves are excited by real current, a TM wave is excited by the displacement current. In the case of TM waves, a conductor that comes near or crosses into a boundary where the magnetic field is generated along the conductor may interfere with the transmission. For example, a nearby conductor other than the line may provide a termination point and thus reduce energy coupled in to the transverse magnetic wave. In general, impairments have more influence on the energy loss of the transmission the closer the impairment is to the surface of the transmission medium. At larger distances from the signal and conductor, moving away from the boundary of the magnetic field generated by the TM wave, a conducting impairment may have little to no impact on the magnetic field. Thus, it is desirable to minimize interference in the space around the cable through which the signal and resulting perpendicular magnetic field extends.

FIG. 2H provides an example of the relative losses incurred by TM and TEM waves, in a plot of frequency vs. loss. As shown, the TM wave has less loss at higher frequencies. The guided wave traveling on and around the guiding wires may be presented itself in different characteristic modes, just the same as those in the traditional waveguides, where each mode is represented by the corresponding eigenvalue and eigenfunction solved from wave equation and boundary conditions. The fundamental TM wave does not have a cutoff frequency, while the higher modes may have their specific cutoff frequencies. The transceiver design may be specifically optimized to excite the specific modes. In general, the fundamental mode has lower transmission loss and low radiation loss. The disclosed transceiver device can effectively convert the RF signal into the guided wave along the medium voltage power wires.

FIGS. 2A-2H illustrate properties of a transverse magnetic field that surrounds a wire, illustrating why a conductor that crosses into the boundary of where the transverse magnetic field surrounds the wire will interfere with the signal surrounding the wire, thus causing loss on the line. Optimizing energy on the line differs for the disclosed TM wave transmissions, influencing both geometries selected for the transceiver's reflector and coupler, both independently and in relation to each other, and influences the enclosure used to enclose the transceiver. TM modes may include a variety of modes, where some modes couple more efficiently to the transmission medium and others splay off in directions away from the wire. The geometries selected for the different TM modes are selected for maximizing the amount of energy output along the transmission medium.

A primary transmission mode refers to the transverse mode tightly coupled to the transmission medium that can effectively transmit the message signal. While the transceiver 206 may generate a number of modes in different directions, modes that are not directed down the transmission medium or have high losses will attenuate or dissipate. In contrast, the primary transmission mode has lower losses and is more tightly coupled to the waveguide for propagation to a next transceiver. Many modes will not persist due to attenuation or ineffective coupling to the transmission medium. In one or more embodiments, a primary transmission mode may be more effectively transmitted using the disclosed transceiver 206, enclosure 205. Thus, one or more embodiments disclosed capitalize on the features of the transverse magnetic field that is generated upon excitation of current at the coupler.

Figure 3A:
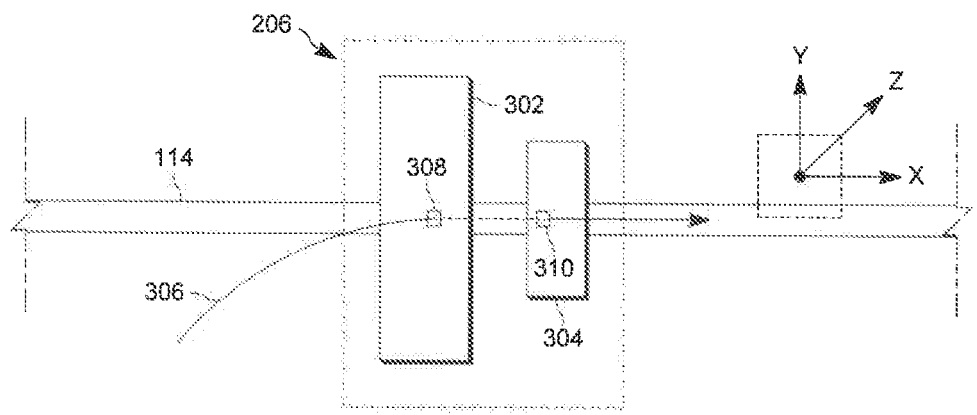
FIG. 3A shows an exemplary TM wave transceiver having a reflector and a coupler.

FIG. 3A illustrates an example of the transverse magnetic (TM) wave transceiver 206, which in this example is shown with a reflector 302 and a coupler 304. As shown in FIG. 1, the TM wave transceiver 206 may be included in transceiver 119 that is positioned in the power line communication system for transmission of surface-waves along a medium voltage power line in the power distribution system. The TM wave transceiver 206 may include reflector 302 and coupler 304, conductive components configured as parallel planar elements in a position that is perpendicular to the transmission medium 114. The planar components are thus not coaxially aligned.

In an example illustration where the transmission medium 114 extends horizontally in an x-direction, the reflector 302 and coupler 304 are positioned in a plane perpendicular to the x-direction, where the plane including the reflector 302 and coupler 304 can rotate in any direction around the x-axis while remaining perpendicular with respect to the transmission medium. The coupler 304 is shown positioned to a side of the transmission medium rather than coaxially aligned, but it is noted that the disclosed techniques include embodiments that may be coaxially aligned since the unique properties of the design may not require such distinction.

Figure 3B:
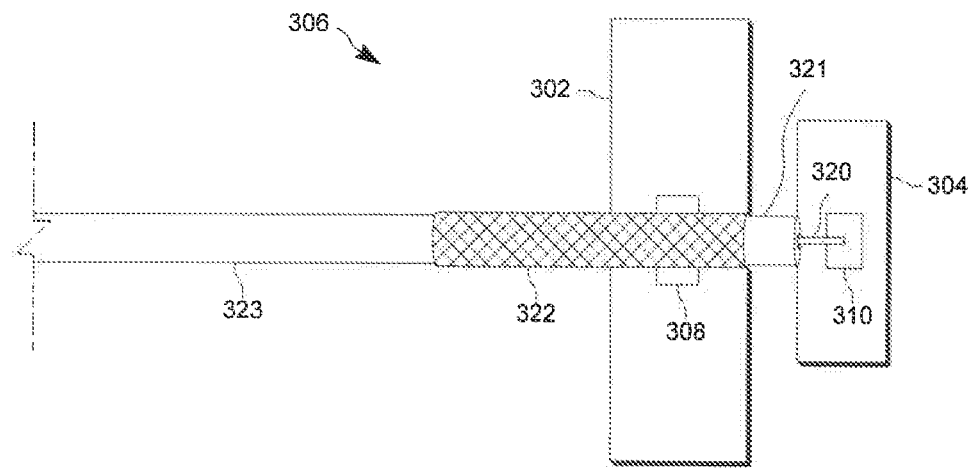
FIG. 3B shows a shielded conductor connection connected to a reflector and coupler in the TM wave transceiver.

Referring to FIG. 3B a shielded conductor connection 306 may connect to a reflector 302 and a coupler 304. Specifically, a coaxial cable 323 is an example coaxial connection 306 that serves as a signal path to transfer signals to the TM wave transceiver 119. References are made herein to a coaxial connection, coax cable, coax, or the like to describe connection 306. However, it should be understood that the coaxial terms are used by way of example and other types of shielded conductor connections with a conductor and shield as described below may apply, including a traditional waveguide depending on the frequencies employed.

The connection 306 includes a central conductor portion 320, which may be a bare copper round wire inner conductor, solid or stranded. The central conductor 320 serves as the main signal path and is electrically connected to coupler pin 310 on coupler 304. The central conductor 320 may be surrounded by a ground shield portion 321, such as a tubular dielectric insulator, which may in turn be surrounded by a protective outer layer 322, such as a plastic outer layer. The shield portion 321, such as the dielectric insulator of a coax, may be configured to connect to reflector pin 308 on the reflector 302. Thus, a coaxial connection is an example of a shielded conductor path that has a shield portion 321 that terminates at the reflector 302 and a central conductor portion 320 that terminates at the coupler 304.

The coaxial connection 306 represents functionality of a conductor and shield, which can also be accomplished using a PCB, e.g., pores on a PCB with a planar trace on the coaxial connector just behind the reflector. Thus, FIG. 3B is representative of how the connection is made between the reflector and coupler, but a PCB with traces to the reflector and coupler or a similar design may be operable such that the shield or reflector portion of the connector 306 is traced to the reflector and a conductor line 320 is coupled to the coupler. The outer layer 322 may be a shield or reference line.

As described in more detail below, the reflector 302 and coupler 304 may be integrated in to an enclosure, and the enclosure may include a coaxial port and a coaxial feed port may be configured to connect the coax to a connection point 308 on the reflector 302, such as pin 308 on the reflector, and a connection point 310 on the coupler, such as pin 310 on the coupler 304. FIG. 3B illustrates the coupler 304 centered vertically in its connection to the coaxial line 306, but alternate embodiments are contemplated. Experimentally, a vertical connection improved performance, but again the geometries for the reflector and coupler and the gap between them may impact the effectiveness of positioning. For example, minimizing the gap between the reflector and coupler lessens the length of the coaxial cable 321 that is unreferenced by the shield.

Figure 3C:
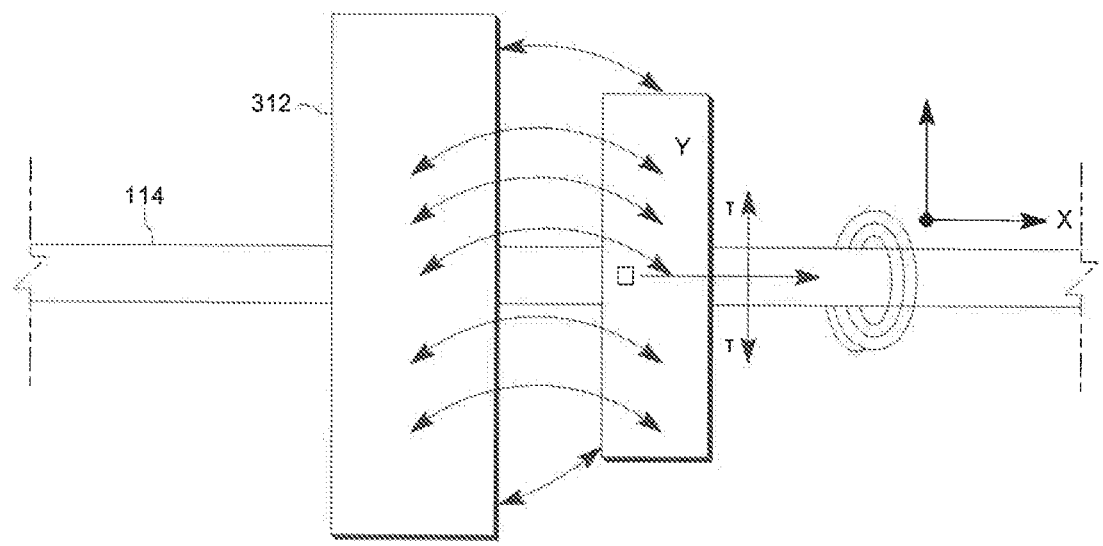
FIG. 3C shows the electric current excitation between the reflector and coupler in a TM wave transceiver by the transmissions via a coax connection to the coupler in the TM wave transceiver.

As shown in FIG. 3C, the current, or signal, transmitted via the coax connection to the coupler in the TM wave transceiver 206 causes current excitation. At the coax point of excitation between the coupler and central conductor 320, E-fields 312 extend from the coupler and are normal to the surface of the coupler and reflector adjacent to the coupler, which induces a transverse magnetic field on the transmission medium. The energy from the excitation point at the coaxial connection is converted into the transverse magnetic wave propagating along the central conductor, and the launch mode generation field is the resulting transverse magnetic field generated by the current excitation. Thus, the coaxial drive causes excitation on the coupler, and energy is converted to a surface wave.

The launch mode generation field varies with the magnitude of the message signal that excites current, resulting in propagation of the transverse magnetic wave along the surface wave conductor. Thus, the TM wave transceiver 206 creates a transverse magnetic field external to the surface-wave conductor that propagates along the surface of the conductor. As will be described in more detail below, multiple modes may be generated by the TM wave transceiver 206, where the mode that is most efficiently entrained to the line will remain in propagation, i.e., primary transmission mode, while modes with higher losses disappear over time.

In one or more embodiments using a single-wire system, in contrast to electromagnetic signals that have a return on the coaxial connection, the disclosed transverse magnetic transceiver does not have a return on the shield portion of the coaxial connection. Single wire surface mode transmission exhibits far less attenuation over frequency than coaxial cable. That is because the field surrounds the conductor and is not constrained by either a lossy return conductor or a supporting dielectric. Thus, the single shield of the coaxial connection and central conductor 320 as shown in FIG. 3B may operate with a single-ended signal.

The interaction between the reflector and coupler is important. As described in more detail below, the relative size of the reflector and coupler are selected for improved performance. In embodiments, the coupler's length must be equal to or greater than half of the reflectors length in order to attain the highest throughput at a frequency range 1 GHz to 1.6 GHz. However, different values for the coupler and reflector lengths will help to optimize for various outcomes. A differential cable or two-wire interface (e.g., twisted pair) may be integrated to provide two connections—a signal and return—to operate with a differential signal. However, a single-ended signal provided by the coaxial connection may maintain the energy for the transmission by the coupler rather than splitting power between split signals. Maintaining a single signal may more effectively transmit a primary transmission mode in the direction of the desired direction of propagation.

Coupling the signal to the medium voltage power line that carries the magnetic field is accomplished by positioning the reflector and coupler on or close to the transmission medium. The reflector and coupler are constructed as a transceiver device, mostly by a planar process on a dielectric substrate. The device is positioned close to the medium voltage power wire, either in contact or non-contact. When in contact, an insulating layer is preferably applied on the reflector and coupler to avoid direct metal-to-metal contact of the coupler or reflector with the wire. In either case, an alignment structure may be used to bring the optimal spatial arrangement. The conductor portion of the coax that connects to the coupler pin 310 is the connected structure that emits the signal for propagating along the surface of the transmission medium. The reflector 302 and coupler 304 are coupled to the transmission medium close enough that the signal emitted by the coupler connected to the coax conductor will facilitate propagation along the surface of the transmission medium.

As shown in FIG. 3C, the reflector 302 and coupler 304 may be configured as described above to generate a field in just one domain. The reflector and coupler are optimally configured to shape the magnetic field distribution generated by the varying E-field to match guide wave modal distribution in the intended frequency range, which depends on the geometry of the transceiver. The absolute length of the coupler depends on the frequency range of interest. The other dimensions, such as the length and width of the reflector, the width of the coupler, and the gap between coupler and reflector can be optimized based on the wire.

The domain in which the E-field 312 may be generated using aligned reflector and coupler planes is in the vertical domain, or y-direction, where at least a portion of the field lines pass between the reflector and coupler, in both directions. When transmitting, there is an E-field in the gap between the reflector 302 and the coupler 304, generated by the source. The time variation of the E-field generates a magnetic wave that closely matches the modal distribution of the transverse magnetic wave mode of wire, thus facilitating the signal energy transfer from the transceiver 206 to the transverse magnetic wave mode guided by the wire 114 shown in FIG. 1. At a receiving transceiver 206, the guided transverse magnetic wave generates a corresponding E-field in the gap, which will be received. The emission of the signal from the coupler 304 along the transmission medium 114, and the field created between elements 302 and 304, in turn generates a magnetic field that couples to the surface-wave conductor, as described in FIG. 2, such that one or more transverse magnetic modes are coupled to the transmission medium, or medium voltage power line. The reflector 302 and coupler 304 may be configured so that the magnitude of the E-field is proportionate to the magnitude of the signal to transmit.

Figure 3D:
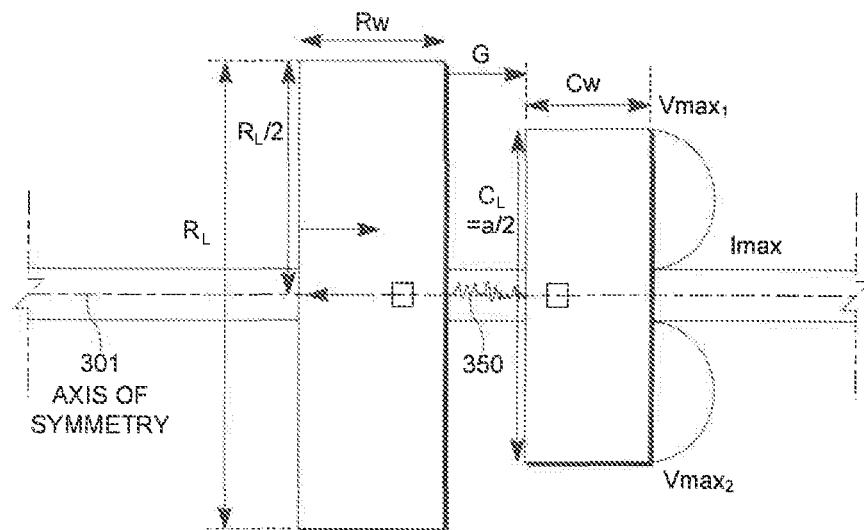
FIG. 3D shows relative geometries between the reflector and coupler in a TM wave transceiver have.
Figure 3E:
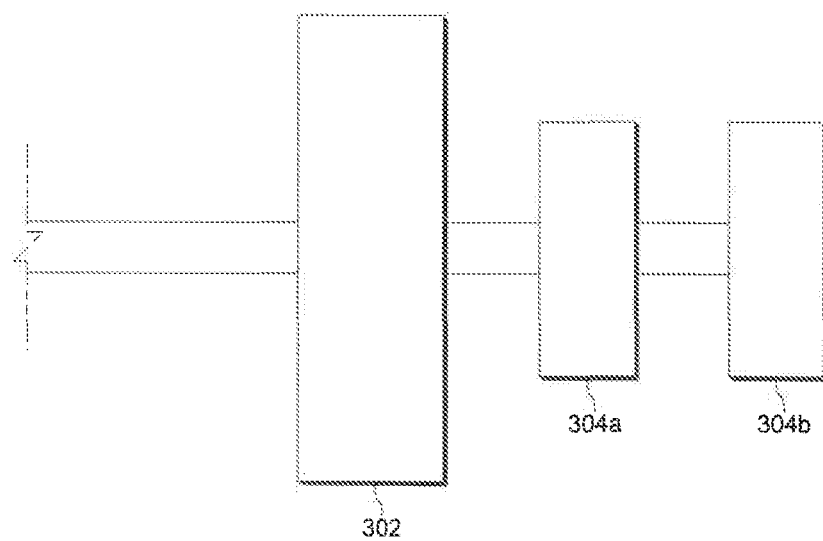
FIG. 3E shows a reflector/coupler embodiment paired in a 2:1 ratio.
Figure 3F:
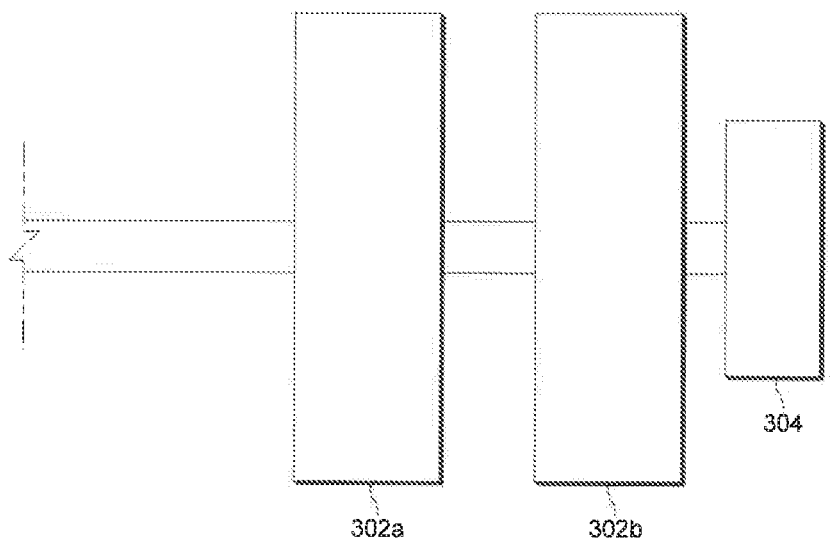
FIG. 3F shows a reflector/coupler embodiment paired in a 1:2 ratio.
Figure 3G:
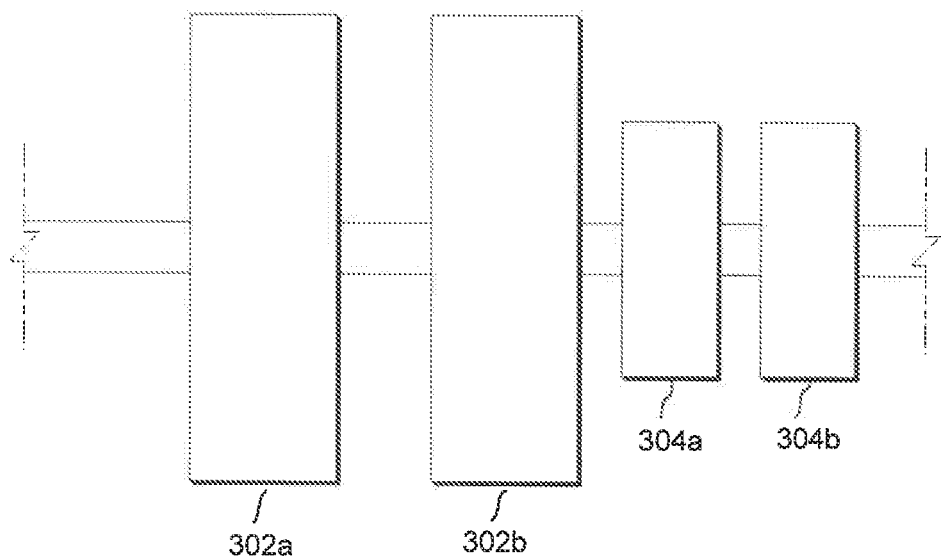
FIG. 3G shows a reflector/coupler embodiment paired in a 2:2 ratio.

The size and shape of the reflector 302 and coupler 304, and their relative shapes and sizes, may impact performance of the TM wave transceiver. Referring to FIG. 3D to describe embodiments, $R_L$ is a measurement of length of the reflector, $R_W$ is a measurement of width of the reflector, $C_L$ is a measurement of length of the coupler, and $C_W$ is a measurement of width of the coupler. In some preferred embodiments, the coupler's length may be a value that is between one that is approximately equal to length of reflector and one that is approximately half the length of the reflector to have a high peak throughput in our frequency band of interest (1 GHz to 1.6 GHz). The optimal ratio between the coupler and reflector is dependent on the application, and the desired balance between overall bandwidth, average insertion loss, minimum insertion loss, and amplitude flatness. In some embodiments, the best performance occurs when the width of the reflector and coupler are approximately equal. As used in the specification and the claims, the term "approximate" encompasses variations of 5% or less.

In an example of surface wave communications in a power line communication system, the surface waves may be millimeter-waves having frequency range in the magnitude of GHz, such as in a frequency range spanning from 20 GHz-300 GHz. In one or more embodiments, the message signal for transmission using surface waves and the surface-wave conductor has a frequency of at least 1 GHz, which includes ultra-high frequency and microwave electromagnetic wave signals. Wi-Fi networks typically operate in 2.4 GHz or 5 GHz bands. There are also 60 GHz wireless network protocols developed for transmitting large amounts of data. The performance of the TM wave transceiver in any intended frequency range are dependent on the transceiver geometry and electrical properties, as well as the physical and electrical properties of medium voltage power wire. These parameters include the length, width, thickness and conductivity of reflector and coupler, the dielectric constant and the thickness of the substrate, and the wire size and conductivity of the wire. The relative position of the TM wave transceiver and the wire is also important.

The height and/or length $C_L$ of the coupler may be determined based on the frequency of the signal to be transmitted along the surface-wave conductor, such as the TM wave transceiver 206. The height and/or length $C_L$ may determine how effective the coupler is for transmitting at a particular frequency. For a set of transceiver geometries ($C_L$, $C_W$, $R_L$, $R_W$), the geometries can be scaled by a common factor in order to scale the center frequency of the resonant passband by the inverse of that scaling factor. For example, if a set of transceiver geometries resonates at a center frequency of fc, then reducing all of the transceiver geometries by a factor two will result in doubling the resonant center frequency. Thus, the wavelength of the signals to be transmitted by the coupler may drive the length of the coupler. By way of example, a signal having a frequency of 1 GHz may have a wavelength of approximately 12 inches, (1 GHz has a wavelength of 30 cm, which is roughly 12 inches, where wavelength=speed of light/frequency=2.9979×10^8 meter/1 GHz=29.98 cm~12 inches). The coupler length may be determined relative to the wavelength size, such as ½ of the wavelength at 6 inches or ¼ of the wavelength at 3 inches. In one or more embodiments, the length $C_L$ of the coupler is equal to or less than one half-wavelength of the lowest frequency or frequencies of the signal to be transmitted. Thus, the cutoff of the wavelength may be related to the length of the coupler. The guided TM wave along a wire may travel in the fundamental wave mode where there is no cutoff frequency. However, when the TM transceiver's performance in coupling the signal into a TM wave has well-defined band-pass characteristics, those characteristics are not only dependent on the transceiver design, but also dependent on the conductivity of the wire and the relative position of the transceiver to the wire, i.e. the return loss of the transceiver as shown by an the S11 curve differs when it is far from the wire as opposed to when it is mounted to the wire.

Since the TM wave transceiver 206 can function as both a receiver and a transmitter, the reflector 302 may act to reflect the waveform that passes through the coupler 304 when receiving signals. In receive mode, the signal comes to the coupler 304, but often not all of the signal is injected into the coupler 304. Practically, at least part of the signal passes through the coupler, and towards the reflector.

Further, a current may be induced in the opposite direction of signal transmission. Referring to FIG. 3 D, the transmission between pins 308, 310 creates standing waves on the coupler having $V_{max1}$ and $V_{max\ 2}$ of the signal, corresponding to the top and bottom of the coupler 304, where Imax occurs in the middle of the coupler 304. A message signal 350 sent between pin 308 and pin 310 is a signal within the coaxial cable, such as a TEM wave. Thus, there is naturally a return current induced equal and opposite to the direction of signal transmission, which is how a referenced single-ended signal operates. In the case of TM waves described herein during transmission, transmission modes may be directed away from the transmission line, thereby sending current at different directions from the coupler that may not be completely terminated by the reflector.

If the reflector width is too large, the signals that pass through the wide reflector may reflect off the edge of the reflector furthest from the coupler. For example, consider that if the message signal has many peaks and valleys at variable heights and widths, the return current induced is equal and opposite to the direction of signal transmission. At the connection point between the coax and pin 308, the message signal sees the connection point as a stub, causing return current to see the back (left edge) of the reflector as a stub. Thus, it may be desirable that the reflector size be large enough to reflect signals that pass through the coupler when the TM wave transceiver 206 transmits or receives along the transmission medium. However, as described above, a reflector that is too large may act as a stub on the signal reference line, such that the reference signal bounces off the back wall of the reflector and returns in the direction of transmission by the coupler, but is out of phase with the desired current.

When the return current reflects off the back (left edge) of the reflector, the reflection is out of phase and interferes with the message signal's integrity. Thus, when a single-ended signal, in contrast to differential, is transmitted by the coupler, the reference signal may cause ripple and narrow-band disappearances in frequency response, known as "suckouts," in the signal due to currents created in the reflections that are out of phase with the desired current, causing destructive interference. The present inventors found that if the reflector and coupler have a length of 8 inches for the intended frequency range of 1 to 1.6 GHz, and when the relative ratio of reflector length and coupler length is close to or below ½, or above 2, the coupler's performance exhibits very different characteristics. The length of the coupler and/or the reflector may in some embodiments be approximately one wavelength of the intended signal frequency, but may be finally optimized considering the characteristics of the wire and the relative position of the coupler and reflector to the wire and to each other.

Further, a reflector that is too large may reflect the signals received in all directions. The reflections that are directed away from the transmission line may be acceptable, but reflections in the direction of the transmission from the coupler down the transmission medium may be impacted by large reflections. Thus, the reflector size should be small enough that reflections are minimized. In one or more embodiments, the reflector minimizes stub length while having an adequate area to terminate the field generated by the coupler.

As described above, the TM wave transceiver 206 may generate a plurality of TM modes, e.g., TM00 TM01 TM02, etc. where only one or a subset of the waves generated couple efficiently to the line, while others splay off in directions away from the wire. Geometries of the reflector and coupler may be selected based on a combination that puts the most energy into the desired mode, to more efficiently energize the desired mode, or the primary transmission mode.

In one or more embodiments the geometries of the reflector and coupler are designed to focus on creating a TM01 mode as the primary transmission mode. As shown in FIGS. 2A-2C, the TM01 may be referenced as magnetic field with varying strengths at radial distances from the wire, in contrast to modes that are referenced inside the transmission medium. As described in more detail below, the wire size does not impact the design since the TM01 mode is referenced by the surface of the wire, regardless of the wire diameter, in contrast to modes that are in the wire. Thus, the TM01 mode may be desirable in embodiments as the primary transmission mode. In one or more embodiments, the geometries maximize not only generating a strong TM01 which exists at varying strengths at certain distance from the line, but also creates a peak at a certain radial distance from the line. For example, referring to FIG. 2C, the peak of magnetic field strength occurs in space range 3, represented by a radial distance (or range of distance) from the line. Thus, in one or more embodiments, the geometries of the reflector and coupler create a magnetic field at a distance far enough from the transmission medium that not only resonates at the frequency of interest for transmission but is physically large enough compared to the conductor to encompass a point where we desire the magnetic field strength to be at its maximum. The coupler size may determine initially the size of the magnetic field, but the reflector size and position relative to the coupler may determine how much of the launch mode generation field terminates at the reflector versus an amount of reflection the magnetic field is exposed to when reflected by the reflector.

Notably, a TM01 mode that surrounds the surface-wire conductor is susceptible to conductive interference that crosses into the magnetic field propagating along the surface-wire conductor. Thus, in one or more embodiments, the reflector and coupler may be the only conductive materials within the device 119 or part of the TM wave transceiver 206.

Experiments were preformed to find geometries that placed the most energy into the mode having the least loss. In one or more embodiments, the geometries are configured to energize a primary coupling of the transmission mode to the surface-wire conductor with the lowest losses and the tightest coupling to the surface-wire conductor to minimize insertion loss in the system.

A reflector width may be selected so that reflections comprising a reduced version of the original signal will be only slightly out of phase with the message signal, thereby minimizing delays. Further, a reflector length is selected to provide an adequate area to terminate the E-field generated by the coupler, where a smaller reflector that is positioned close to the coupler influences the E-field generated by the coupler. The same portion of the reflector that influences the field generated between the coupler and reflector is also a portion of, or overlaps with, the portion of the reflector that reflects return current directed towards the reflector.

The reflector size may be determined relative to the size of the coupler. As shown in FIG. 3C, the E-field lines 312 may be terminated by the reflector to direct transmissions away from the reflector and direct energy forward. Thus, the reflector 302 may terminate the coupler's signal, forcing signals forward and not in the reverse direction, i.e. to the left in FIG. 3. Using a reflector 302 that is longer than the coupler ($R_L > C_L$) may assist in directionality of the mode of transmission. For example, as shown in FIG. 3D, because the coupler 304 is shorter in length than the reflector ($C_L < R_L$), the E-field lines that extend beyond the height of the coupler 304 and/or extend from the top or bottom of the coupler that are directed in the direction of the reflector may be terminated completely or in part by the reflector since the reflector extends in length past the top and bottom of the coupler. The reflector may function as a stub to E-field lines directed in the direction of the reflector, preventing all or at least a portion of the E-field generated between the reflector and coupler from extending past the reflector, i.e. towards the left of the reflector in FIG. 3D. Thus, the length of the reflector ($R_L$) may be determined based on the coupler size and how much energy to direct in the forward direction. In some embodiments, where the E-field lines are directed from the coupler towards the reflector, the termination point of the E-field line on the reflector is at a distance of up to one half wavelength away. Thus, the width of the reflector must be wide enough and close enough to the coupler to terminate the E-field lines up to be present up to ½ wavelength away.

In one or more embodiments, the ratio of the width of the reflector to the width of the coupler is 1:2 and the ratio of the length of the reflector to the length of the coupler is 1.5:1. Approximate measurements that were tested to have low insertion losses using these ratios were $R_L=8.375"$, $R_W=0.5"$, $C_L=5"$, and $C_W=1"$. In some embodiments, the transmission was effective with a $R_L=8"$, $R_W=1.5"$ for the reflector and $C_L=6"$, $C_W=1.5"$ for the coupler. Other embodiments are contemplated, as are different ratios of sizes. For example, in one or more embodiments, the ratio of the width of the reflector to the width of the coupler is 1:1 and the ratio of the length of the reflector to the length of the coupler is 2:1 or 1.5:1. In one or more embodiments, the reflector is always longer than the coupler.

The reflector width may be determined based on a width that best minimizes reflections from the coupler as a function of at least one of the widths of the coupler, the length of the reflector relative to the coupler, the magnitude and location of the E-field between the reflector and the coupler, and/or a spacing between the reflector and coupler. In one or more embodiments, the reflector width ($R_W$) is less than that of the coupler width ($C_W$). For example, the ratio of the width of the reflector to the width of the coupler may be x:y where x<y, so that the reflector is thinner than the coupler. A thinner reflector may be better to minimize reflections. However, depending the length of the reflector relative to the coupler, the magnitude and location of the E-field between the reflector and the coupler, and/or a spacing between the reflector and coupler, a thinner reflector may not perform as well for minimizing reflections. For example, some lab results indicate that a 1:1 ratio of width between the reflector and coupler results in less loss (i.e., loss of throughput measured in dB). during transmission. In these one or more embodiments, the width of the reflector and coupler may be the same, while the reflector remains longer than the coupler.

In one or more embodiments, the ratio of the width of the reflector to the width of the coupler is x:y where y<x, so that the coupler is smaller than the reflector. The latter scenario may induce more reflections but minimizing reflections may be acceptable under certain conditions.

In one or more embodiments, the gap G, or spacing between the reflector and coupler, may be defined. In one or more embodiments the spacing between a right edge of the reflector 302 and the left edge of the coupler 304 is less than the width of either of the reflector and/or the coupler. In one or more embodiments, the spacing is sufficient to prevent touching between the reflector and coupler, while also less than the width of either the reflector and/or coupler. In one or more embodiments, the reflector 302 and coupler 304 are positioned as close as possibly without touching. When the gap between the two edges is smaller, the produced E-field is stronger. Thus, the spacing may be defined as sufficient to enable influence by the reflector on the E-field generated by the coupler. In addition, the wider the gap, the greater the length of the transmission medium that is subjected to the E-field generated by the coupler. Further, when the coupling distance to the wire changes, the impedance match changes. Thus, the coupler size and signal frequencies for transmission by the coupler may determine a magnitude of the E-field, and the reflector is spaced in the proximity of the E-field. In one or more embodiments, the spacing between the reflector 302 and coupler 304 is maintained at a distance that minimizes destructive interference between return currents that reflect off the back edge of the reflector and the primary transmission mode carrying the signal along the surface-wire conductor.

The reflector 302 and coupler 304 may be positioned parallel to each other, with an approximately equal spacing between a right edge of the reflector 302 and the left edge of the coupler 304, which results in a more symmetric E-field generated between the reflector 302 and coupler 304, and also defines a more predictable termination of the E-field by the reflector 302.

FIG. 3D depicts the reflector 302 and coupler 304 positioned along an axis of symmetry. In one or more embodiments, the length of each of the reflector 302 and coupler 304 in a direction that extends perpendicularly from the direction of the transmission line is larger than the width of each of the reflector and coupler, respectively, that shares or overlaps in space in the horizontal direction with the transmission medium 114. Thus, referring to FIG. 3D to describe such one or more embodiments, where $R_L$ is a measurement of length of the reflector, $R_W$ is a measurement of width of the reflector, $C_L$ is a measurement of length of the coupler, and $R_W$ is a measurement of width of the coupler, the reflector and coupler are configured such that $R_L$ is greater than $R_W$ and $C_L$ is greater than $C_W$.

In one or more embodiments, the reflector 302 and/or coupler 304 are centered on the transmission medium such that the horizontal axis defined by the transmission line is an axis of symmetry on which the reflector 302 and/or coupler 304 are centered. As shown in FIG. 3D, the reflector 302 is centered along the axis of symmetry 301 at a halfway point along the length of the reflector 302, at RL/2, where the length is longer than the width. Similarly, the coupler 304 may be centered on axis of symmetry 301 at a halfway point along its length, at CL/2. In this embodiment, the length of the reflector 302 and/or coupler 304 that extends above the line of symmetry is the same as the length of the reflector 302 and/or coupler 304, respectively, that extends in the opposite direction from the line of symmetry in the same plane.

While the figures depict a single reflector plane 302 and a single coupler plane 304, it should be understood in the context of this disclosure that other vertically aligned configurations of the reflector and coupler are possible. For example, the coupler may be separated into a coupler pair.

Referring to FIG. 3A, the reflector and coupler are communicably coupled via pin 308 on the reflector 302 and pin 310 on the coupler 304. The reflector 302 and coupler 304 may be configured as a reflector plane and coupler plane, respectively, each two-dimensional with a length and width, or having a three-dimensional shape having a length, a width, and a thickness. As described above, the length may be longer than the width based on the configuration with the transmission medium.

When a data or message signal is received by the reflector 308 through connection 306 and the message signal is emitted through coupler 304 for propagation along the transmission medium 114, a launch mode generation field is generated that varies with the magnitude of the message signal. The message signal excites the transverse magnetic surface wave mode on the transmission medium, or surface wave conductor. Thus, the TM wave transceiver 206 creates a transverse magnetic field external to the conductor that propagates down the line as described with respect to FIG. 2A. As described in more detail below, the transverse magnetic field may propagate along the surface wave conductor to a second transceiver, where the second transceiver may be configured to receive the surface wave using symmetrical components.

The figures depict squared shapes, typically rectangles, for both the reflector and coupler. It should be noted that in any of the embodiments, the corners may be rounded and not squared. Rounding the corners may avoid the Corona affect, which occurs at high voltages and causes high charge densities on sharp corners.

As shown in the figures, the coupler may be a continuous, single plane component. Similarly, the reflector may be a continuous, single plane component. The reflector and coupler may be paired. There are multiple embodiments of parallel elements with the reflector and coupler that can be added to optimize the bandwidth, the overall throughput, operational frequency and other parameters. In one or more embodiments, the reflector and/or the coupler could be paired in different ways than what is shown in FIG. 3A, such as 1:2 (e.g., FIG. 3E), 2:1 (e.g., FIG. 3F) or 2:2 (e.g., FIG. 3G.). These configurations may be positioned in the same plane or in some sort of three-dimensional array.

In one or more embodiments, the functionality of the TM wave transceiver is agnostic to the thickness of the transmission medium. Common power lines in a power distribution system, also referred herein as surface wave conductors in the context of a power line communication system, range in diameter. Typical diameters for the surface-wave conductors are from approximately 4 mm to 25 mm or 50 mm, thus varying widely. The disclosed TM wave transceiver does not require direct contact with the transmission medium and may be affixed for transmission along the surface-wave conductor without the need for modification to transmit along different wire gauges.

In one or more embodiments, the coupler length must be sufficient to extend beyond both the top of the transmission medium and the bottom of the transmission line. Thus, the coupler length must be longer than the thickness of the transmission medium If the coupler lengths is not long enough relative to the transmission medium, the coupler and reflector may interact in the vertical configuration along the transmission medium as disclosed herein, without modification based on the size of the transmission medium, such as the size/gauge of a medium voltage power line.

In one or more embodiments, the TM wave transceiver 206 is designed for isolated or indirect contact with the transmission medium. The transceiver 206 is completely isolated from the transmission medium. The coupling is strictly through the fields and not direct metal-to-metal contact. Thus, a direct metal-to-metal or direct current connection between the TM wave transceiver and the medium voltage power lines is unnecessary. In one or more embodiments, the reflector and coupler are positioned on, or close enough to, the transmission medium to emit surface waves for propagation along the surface of the transmission medium. Thus, the TM wave transceiver 206 may emit a surface wave for propagation along the surface-wave conductor without direct contact between either the reflector and/or the coupler and the medium voltage power line.

In one or more embodiments, the disclosed TM wave transceiver 206 functions on either insulated and/or non-insulated transmission mediums. This is in contrast to the well-known transmission technique known as the Goubau line, which required insulation around the conductor. Thus, while some medium voltage power lines have a jacket providing insulation to the wire, there are many medium voltage power lines that do not have insulation, and one or more disclosed embodiments operate on either or both. Using a layer of insulation on the transceiver may eliminate a need for insulation on the wire. The insulation may prevent electrically connecting the transceiver to an uninsulated wire, but the insulation may have virtually no effect on an insulated wire.

Because of the nature of a TM wave surrounding the wire, a conductive material in the TM wave transceiver 206 or device 119 may cause interference or impairment with the magnetic field. In one or more embodiments, only non-conductive materials are used in the TM wave transceiver 206 or device 119, or at least non-conductive in the space occupied by the magnetic field of the primary transmission mode(s). In one or more embodiments, the reflector and coupler are integrated on to a printed circuit board or another non-conductive material or backplate. In one or more embodiments, the PCB includes an insulating top layer over the circuitry to isolate the TM wave transceiver 206 from the surface-wave conductor to which it is near or otherwise affixed to. In embodiments, a FR4 PCB board is used to provide the insulation.

As described in more detail below, the TM wave transceiver 206 may be integrated with an enclosure that facilitates installation of the TM wave transceiver 206 on or near the power line 114. For example, the reflector and coupler (or material on which they are affixed) may be integrated in the enclosure such that when the enclosure is installed on the transmission medium, the reflector and coupler are positioned on or close enough to the transmission medium to emit surface waves for propagation along the surface of the transmission medium. The guided transverse wave mode travelling along the wire is guided by the wire and present close to the wire. Pushing the transceiver against the wire will increase the coupling performance. The closer, the better coupling performance.

In one or more embodiments, the reflector 302 and coupler 304 may be formed with flexible metal, such that when making contact with the medium voltage power line, it will flex to ensure close contact with the transmission medium. However, to prevent metal-to-metal contact where the transmission medium is non-insulated (between reflector/coupler and the surface-wave conductor), a non-conductive material may be inserted between the reflector/coupler and surface-wave conductor.

In one or more embodiments, the reflector and coupler include a form of isolation to separate pins 308 and 310 and/or any physical connection between pins 308 and 310 from the transmission medium 114. For example, a form of isolation may be overlaid directly on the reflector and/or coupler or to a medium to which the reflector and/or coupler are affixed.

Conductivity of the surface affects the propagation of the wave, as more conductive surfaces provide better propagation and less dissipation. The transceiver's performance and the system transmission performance are dependent on the characteristics of the medium voltage power lines, such as the geometry and conductivity. Hence, even if there is a lack of control over the characteristics of the power lines, the characteristics of the transceiver and its associated system are preferably optimized to maximize system performance.

Figure 4A:
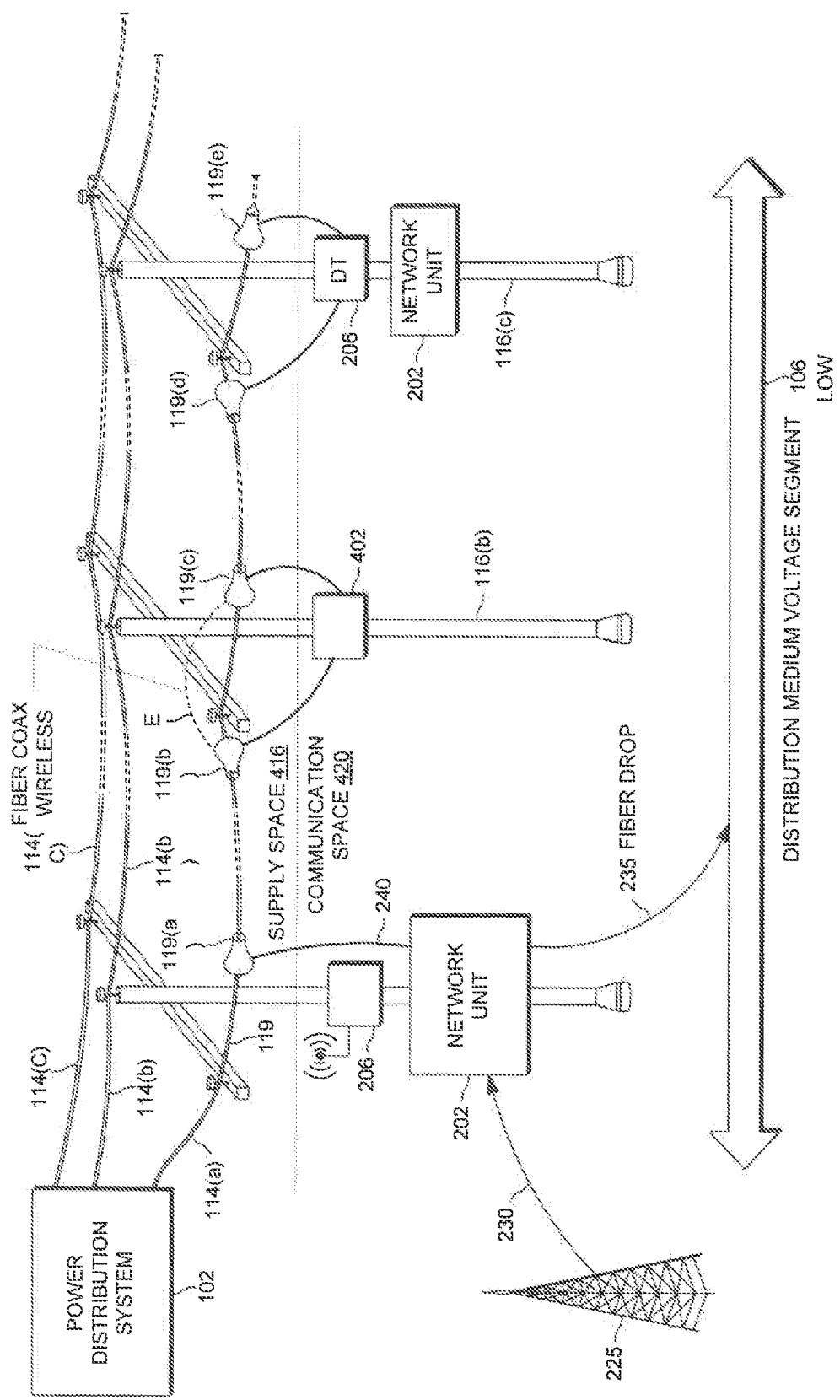
FIG. 4A shows a network unit, which may be communicably coupled to a network connection.

FIG. 4A illustrates multiple transverse magnetic transceivers 119(a)-(e) distributed in a power line distribution system 100 for facilitating power line communications. It should be understood that FIG. 4A depicts an example of components distributed in a power line distribution system 100, but is not exhaustive nor limiting. As will be described below, transverse magnetic wave device 119(a) is shown located on or near first utility pole 116(a), transceivers 119(b) and 119(c) are shown on or located near utility pole 116(b), and transceivers 119(d) and 119(e) are shown on or located near utility pole 116(c). However, FIG. 4A represents a subset of what could exist in a much larger network of transceivers and utility poles in a power distribution system.

FIG. 4A shows a network unit 202, which may be communicably coupled to a network connection 225, such as a microcell site. The network unit 202 located in the power distribution system 102 can be connected to the microcell site 225 via a connection 230, such as by fiber and/or cable. It should be understood that additional connections 230 may be used, such as a wireless component, either active or passive. As described in more detail below, the network unit may be coupled to an access point 204 (shown in FIG. 4B) for distributing signals to end users at customer premises 124.

Disclosed herein are techniques for distributing data to end users that may be employed instead, or in addition to, fiber or physical connections and/or the use of antennas. Conventionally, access equipment on a utility pole may be configured with a physical connection, such as a fiber drop 235 shown extending from the network unit 202. Where available, the fiber drop may to deliver content to end users 124 (shown in FIG. 1) or to a location further downstream. However, such solution requires a fiber or cable installed to reach the termination point. Further, equipment on the utility pole may be integrated with an antenna system (not shown) to provide connectivity for mobile devices. Such antenna systems are commonly integrated into the infrastructure of the power distribution system, with network units and antennas positioned on the pole architecture and along the power lines, separately communicating information between the microcell sites to mobile devices that are not located in a static position. However, antennas operate in free space and transmissions distances are limited.

As disclosed herein, the network unit 202 may be communicably coupled to the transceiver 119 that is positioned along the power lines, the transceiver 119 for emitting signals along the power lines present in the power distribution system. Generally, the connection between the network unit 202 and the transceiver 119 may be physical, however in some embodiments passive or active wireless connections may be used. The transceiver 119 can receive signals from the network unit 202 with information that originated in the network 225 and transmit the signals over the power lines. For example, via network connection 230, the network unit 202 may combine the network signal received from the network connection 225 with a carrier-wave signal, generate a transmission, and send the transmission to transceiver 119 through connection 240. Transceiver 119 can launch or otherwise emit a data transmission as a guided transverse magnetic wave on the surface of the medium voltage power line.

It is notable that antennas used for transmitting data from the network connection 225 to mobile end users 124 are distinguishable from the disclosed power line communication system that uses transceivers to emit surface-wave transmissions. For example, when radio waves encounter an antenna they are converted into electrical energy and radiate in all directions from a center point of the antenna in space, until they are reflected or absorbed. Antennas rely on free radiation or over-the-air links between antennas, in contrast to the use of a transmission medium or waveguide. As disclosed herein, surface wave transmissions that propagate along a conductive transmission medium use magnetic fields having circular geometries to propagate along the transmission medium. In fact, as described with respect to one or more embodiments below in more detail, a tighter coupling of the signal and thus the transverse magnetic field to the transmission medium is desirable to minimize free radiation. Transmission in free space would prevent certain features of the disclosed techniques from functioning.

A device 119 on or near the utility pole can also receive a transmission over the power lines and forward it to the network unit 202. The network unit 202 can down-convert the transmission and forward it to a network or to a microcell tower 255.

The device 119(a) may connect to another device 119(b) symmetrically-positioned along the same transmission medium. The symmetrically-positioned device 119(b) may function as a repeater by transmitting the energy received via a transceiver 206 in the device 119 to a repeater 402 and back up to another device 119(c) for continued transmission of the surface-wave propagation of the signal along the surface line conductor 114.

Figure 4B:
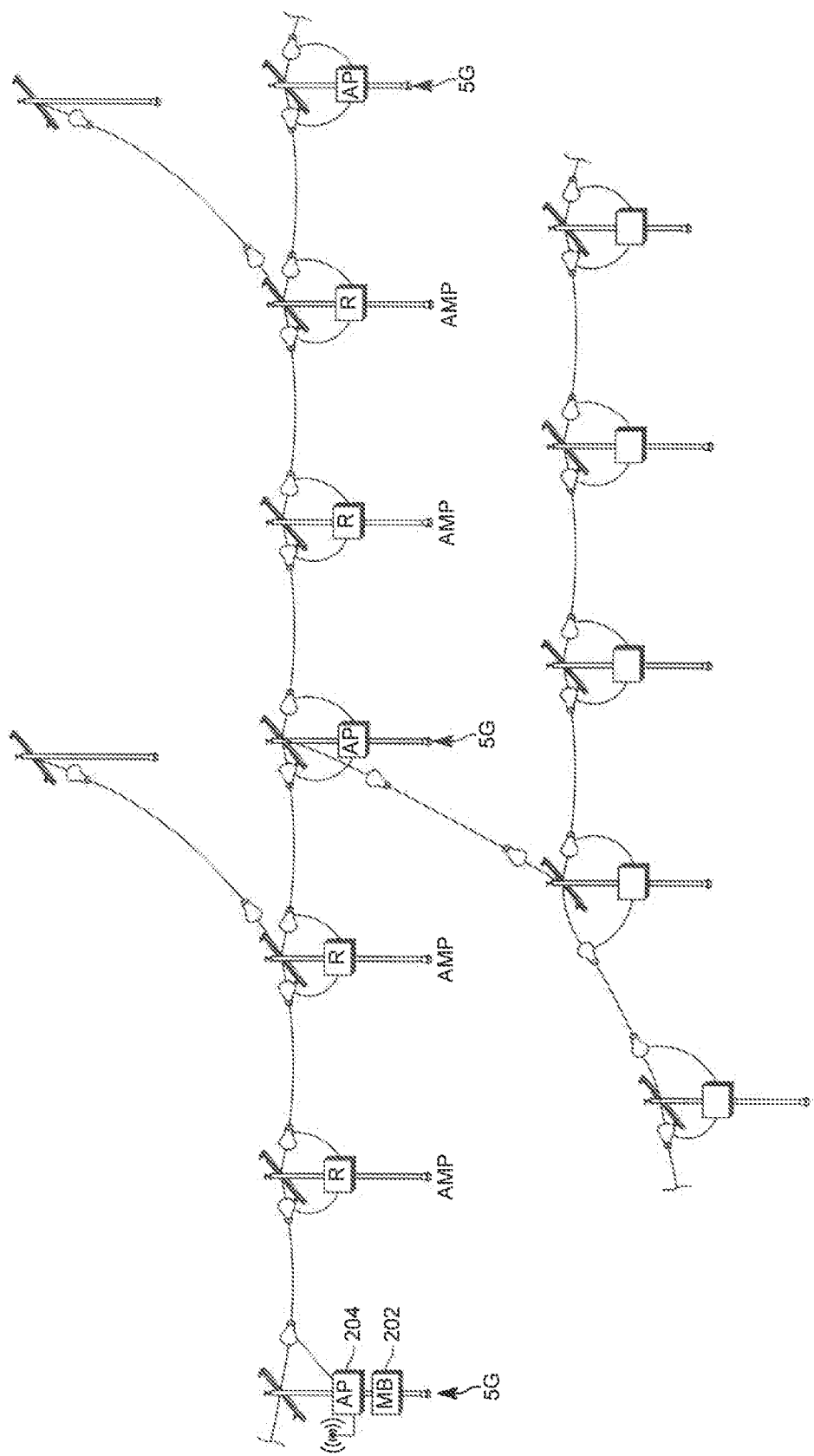
FIG. 4B shows a larger network of utility poles with network boxes, access points, and repeaters depicted at various points within the network.

FIG. 4B illustrates a larger network of utility poles with network boxes 202, access points 204, and repeaters 402 depicted at various points within the network. FIG. 4B depicts multiple transceiver devices 119, some of which initiate propagation of the surface wave signal and some of which serve as repeaters of a signal received along the surface of the surface conductor. As shown, the repeaters may serve to connect network units with components several utility poles away for continuing a signal originated at the network unit 202 using only the transceiver device, repeaters and the transmission medium.

The couplers and repeaters may be connected along segments of the power line as shown in FIG. 4B, but may also be connected through different types of connections. For example, a first repeater may be connected to another repeater via physical, fiber, Ethernet, optical, or wireless interfaces, as shown by connection E in FIG. 4A, which should be understood to represent a physical connection and/or a wireless path of communication. The wireless connectivity between components in the PLC system, such as the wireless embodiment for connection E, may be used when power line connectivity is lost between neighboring repeaters.

The repeaters 402 may be positioned in the network of electric power lines to permit information to travel longer distances on the power lines, enabling power line communications capability. For example, the repeater and power line exchange may include the communication of data (a signal in a digital format) between transceiver for (upstream) and downstream communication.

In some embodiments, repeaters 402 may be mounted near an electrical distribution transformer or similar location providing access to an electrical power line. The distribution transformer may be located above-ground or below-ground, such as suspended from a pole overhead, for example. The distribution transformer may reduce a higher voltage from the electrical power line to lower voltages at levels that may be delivered to end user consumers. In some embodiments, the lower voltages that may be consumed by end users are voltages including and between 110V-220V.

The transceiver 119 and/or repeaters 402 may include a switch to switch between power lines. An isolation device and/or capacitor device may be provided before and/or after a repeater 402 in the path of upstream communication and/or downstream communication. Isolation and capacitor couplers may connect the repeaters 402 to the power line. Separate logical networks may be created and used over the electric power lines, such as by utilizing standard protocols such as standards. Thus, the power lines may serve to enable different services. For example, a first service provider may use the power lines for a backhaul connection between transceivers and base stations, and a second service provider may use the power lines for a logical network for WiFi hot spots, and a third service provider may use the power lines for networking electric meters. Each network may have bandwidth allocated for each application by a management system.

The transceiver 119 may be utilized by utilities for other purposes, such as to read meters, detect power outages, etc. The repeaters A may provide one or more interfaces, such as a fiber optic interface or an Ethernet interface, that interface the transceiver 119 and/or repeaters with external equipment, such as, for example, WiFi access points, transceiver stations, low voltage gateways, electric meters, or the like. Thus, the repeaters A may receive communications over a power line, including external communications, and communications over Ethernet, and/or fiber.

Referring again to FIG. 4A, it is important to note that the location of the components used for the power communication line are subject to requirements defined by the FCC and National Electric Safety Code. For example, one of the most fundamental safety recommendations by the National Electric Safety Code (NESC) is the separation of supply space (power distribution) and communications space on utility poles. Thus, consistent with current regulations of the FCC and electrical safety codes, FIG. 4A illustrates a communication space and a supply space with requirements as to the types of components that may exist in either space.

The supply space 416 (or the electrical supply zone) is located in the uppermost area of a pole, where electrical equipment (including electric distribution cables, transformers, and capacitors) is found. Supply space wiring may include different voltages, and often consists of non-insulated conductors. For safety reasons, the highest voltages are in the highest position on the pole. Only authorized electrical workers can work in or above the supply space, and is also referred to as the power company's space.

The communications space 420 is the lowest space on the pole and is located below the supply space. Attachments in this space include cable, broadband, fiber, telephone, traffic-signal control wiring, and more. The communication space is generally the location on the utility pole that is opened up for CATV and telecom providers for installing equipment for communications.

Generally, the communication space exists below the supply space. The communication space is the space where workers can work safely and passage through or under which is safe. The supply space includes the energized electric portion of the pole space, which poses an unsafe spacer for workers. Presently, the NESC requires forty inches between the lowest energized electric line and communications cables/equipment. Thus, it is generally understood that the supply space encompasses the energized portions of the space, which is a space that can pose a danger to workers or contractors that are working on the pole.

Some utility services have installed communications devices in the supply space, such as placing antennas at the top of the pole, as the communications devices themselves may not present a danger by presence in the supply space. However, it is undesirable and often a violation of utility industry requirements to move any supply devices in to the communication space due to the danger posed to anyone in the vicinity of the supply device, and such strict clearances defined by the industry remain the safest option.

It should be noted that there may be unused space located directly below the supply space and directly above the communication space, which may exist for safety. The neutral space is specified by the NESC to protect communications workers from dangerous voltages and to separate communications conductors from electric supply conductors. As shown in FIG. 4A, the distributed transformer, for example, may be located in the supply space.

The distance between poles may be as is conventional in a power distribution system. It should be understood that the one network unit 202 and three utility poles 116(a)-(b) are depicted in FIG. 4A for purposes of simplicity. By way of example, FIG. 1 depicts three medium voltage power lines, where one or more of the three electric power lines B may be used to enable power line communication functionality including data transmissions. Though connectivity via three power lines are provided in the illustrated embodiment, any number of power lines and associated functions with regard to the present embodiments may be employed. In an example, there may be one or more utility poles located between the poles shown in FIG. 4A, such as additional poles between utility pole 116(a) and 116(b). While transceivers are shown on each utility pole depicted in FIG. 4A, it should be understood that the network of utility poles may or not each have a transceiver or other components described herein. Depending on distances and a performance of the transceivers 119 or condition of the medium voltage power cable 114, the poles located in between may or may not have additional transceivers and equipment to facilitate the disclosed techniques. In some embodiments, the transceivers are able to emit signals along the medium voltage power line with enough signal strength to propagate along the medium voltage power lines such that retransmission by another transceiver 119 may not need to occur.

Again referring to FIG. 4B, an example of a larger network of utility poles and components in the power distribution system to facilitate power line communication based on the disclosed techniques shown in FIG. 3B.

Additional equipment and components may be installed or integrated to work with the disclosed power line communication system, such as the network box 202 and access point 204. However, as disclosed herein, different embodiments may use the same, different, or a combination of components that work with the transceivers to facilitate power line communication. One network unit 202 is shown in FIG. 4B mounted to one of the example utility poles 116, but there may be more devices mounted to the poles. Further, transceivers 119 are illustrated as positioned along the left utility pole and right utility pole in FIG. 4B, but there could be one or more additional poles in between that are not shown for reasons of simplicity. The additional poles may or may not also have a transceiver 119.

Amplification of the network signal may be needed when communicated through power cables 114. However, when power is provided through power cables 114, the power does not need amplification. Some embodiments provide an amplifier in one or more repeaters 402 that amplify the network signal. The network signal is routed from a transceiver 119 to repeater 402, amplified, and then routed to another transceiver 119 (or back to the same transceiver). Transceiver 119 then continues to send the amplified signal along power cable 114.

In some embodiments, a single power cable 114 is used to transmit both upstream and downstream data transmissions. A time division duplex (TDD) mode may be used such that the upstream transmission and the downstream transmission are not processed at the same time at a repeater 402. The data transmission in both the upstream and the downstream directions occurs in the same frequency range. Thus, using diplex filters to provide isolation between the upstream amplification path and the downstream amplification path may not be possible. Some embodiments provide amplifier systems that amplify data transmissions sent through power cables 114 in both the upstream and downstream directions.

The use of one amplifier system to amplify the data transmissions requires some control to route the data transmissions through different paths depending on whether the data transmissions are in the upstream direction or the downstream direction. In some embodiments, the control is limited to either being sent on the single power line or being locally generated at repeater 402.

Figure 5:
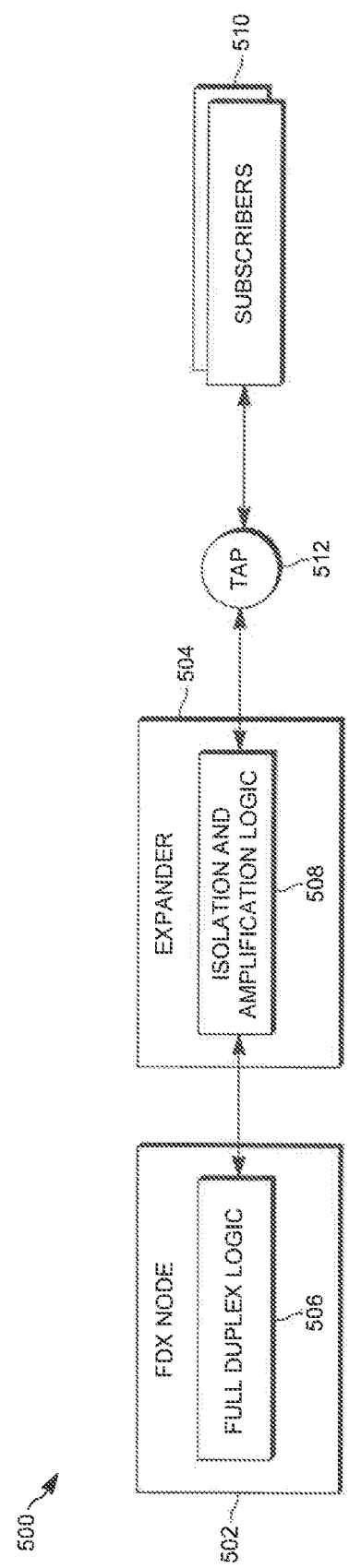
FIG. 5 shows a simplified system for amplifying full duplex signals.

FIG. 5 depicts a simplified system 500 for amplifying full duplex signals according to some embodiments. System 500 includes a FDX node 502, an expander 504, and subscribers 510. It will be understood that other components of the network may be included, such as other FDX nodes 502 and expanders 504 may be included. Further, although not shown, a head end may be located upstream of FDX node 502. In some embodiments, FDX node 502 may be part of a remote physical (PHY) device that can be located closer to the subscriber's premises, such as in a node located in the neighborhood where the subscribers are located. The relocated physical device is referred to as a remote physical device (RPD). FDX node 502 converts packets on a digital interface, such as an Ethernet interface received via a digital network, such as via optical fiber, to analog signals, such as radio frequency (RF) signals, on a hybrid fiber coaxial (HFC) network. FDX node 502 sends the RF signals to modems located at a subscriber's premises via an analog network, such as via coaxial cable.

Full duplex signals may include different types of traffic, such as data and video. In the downstream direction, signals from the head end are sent through FDX node 502 toward subscribers 510 through expander 504. A group of subscribers may be connected to a tap 512 that provides connections to subscribers 510. Subscribers 510 may include subscriber devices, such as modems that receive the downstream signals and send the upstream signals. In some embodiments, the modems include cable modems, but other devices may be appreciated, such as gateways. In the upstream direction, subscribers 510 send upstream signals toward the head end through expander 504 and FDX node 502.

In the downstream direction, FDX node 502 may receive a downstream signal from the headend and process the downstream signal using full duplex logic 506. As discussed above, FDX node 502 may receive packets via a digital network. Then, FDX node 502 sends the downstream signal to expander 504. The downstream signal is sent via an analog network. Expander 504 then amplifies the downstream signal in the analog domain. Also, in the upstream direction, expander 504 receives upstream signals and can amplify the upstream signals in the analog domain. Then, expander 504 sends the upstream signals towards the head end, which eventually reach FDX node 502. The upstream signals are sent via the analog network.

Expander 504 receives the downstream and the upstream signals in the same frequency band, which may be a range of frequencies that includes both the downstream and the upstream signals. In some embodiments, the downstream and upstream signals are sent at the same time, but in other embodiments may be sent at different times. Expander 504 may process the downstream and upstream signals using isolation and amplification logic 508, which may separate the downstream and upstream signals that are sent in the same frequency band. Isolation and amplification logic 508 then can amplify the downstream signal using a first path and the upstream signal using a second path. The amplification is performed in the analog domain while isolating the downstream signal and the upstream signal from one another. After amplification, expander 504 may send the downstream signals toward subscribers 510 and send the upstream signals toward a head end.

In some embodiments, FDX expanders 504 may replace legacy analog amplifiers in the network. The use of FDX expanders 504 allows full duplex traffic to be sent in the network without having to replace the legacy analog amplifiers with FDX nodes 502. Also, the connection between FDX node 502 and FDX expanders 504 may be transmit analog signals, such as radio frequency (RF) signals, that may be communicated over a coaxial cable instead of fiber. This means that the signals in the downstream direction from FDX node 502 to FDX expanders 504 may be in the analog domain. If fiber was used, then the communications from FDX node 502 to another FDX node may be in the digital domain, which would require the coaxial cable to be replaced between two FDX nodes 502.

The FDX system may use the switched amplifier as described herein.

Figure 6A:
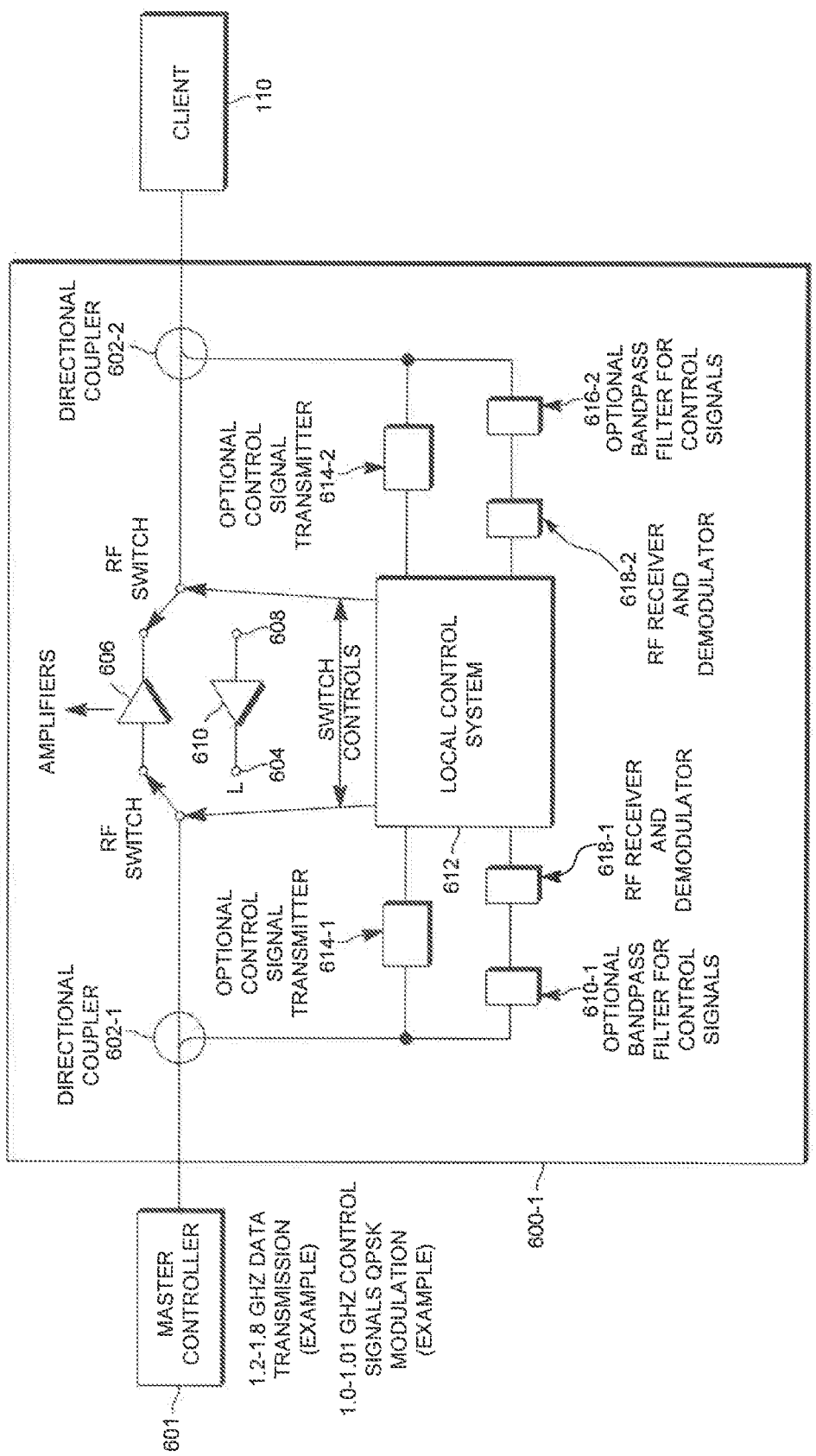
FIG. 6A shows an exemplary dual switched amplifier.
Figure 6D:
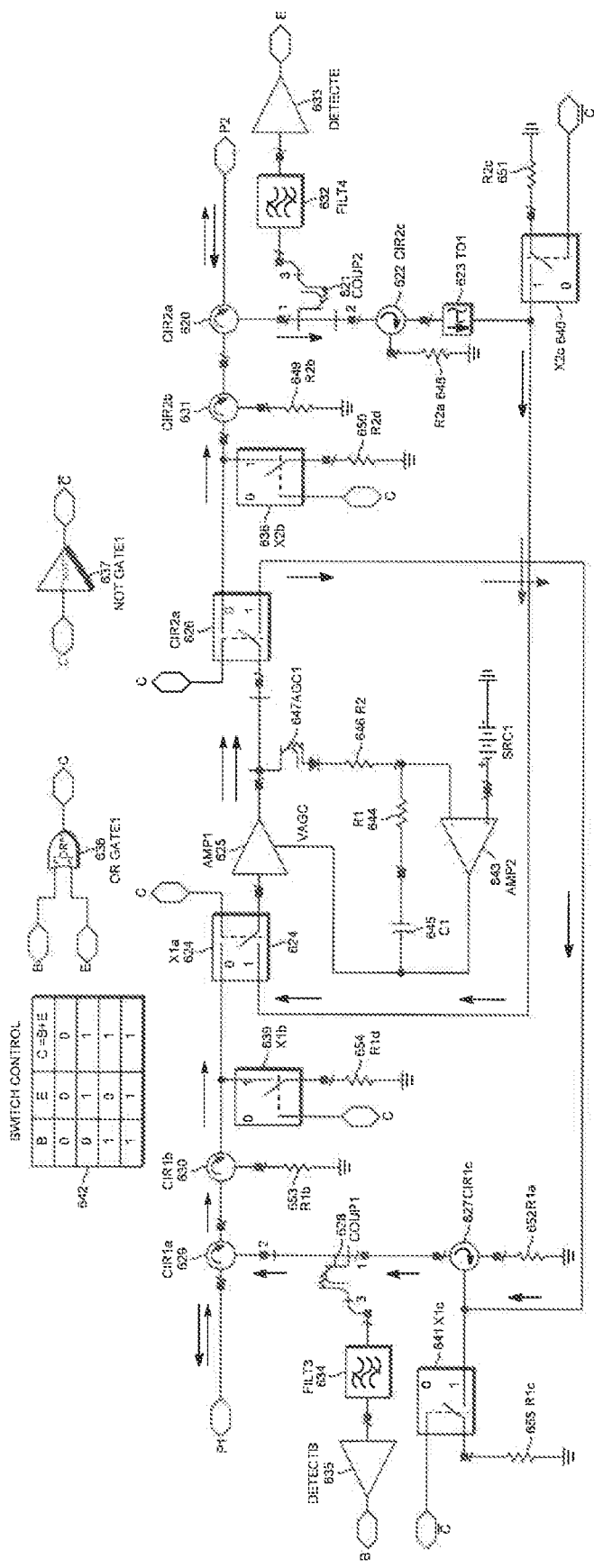
FIG. 6D shows an exemplary bi-directional switched amplifier.

FIGS. 6A and 6D depict different examples of switched amplifiers 600 according to some embodiments. FIG. 6A includes separate upstream and downstream amplifiers in a dual switched amplifier 600-1 and FIG. 6D includes a single amplifier that is switched between two directions in a bi-directional switched amplifier 600-2. Both amplifiers 600-1 and 600-2 may operate in a time division duplex (TDD) mode. In this example, the upstream transmission and the downstream transmission from power cables 114 are not processed at the same time. In this example, the clients (e.g., subscriber devices in customer premises 124) cannot transmit or receive at the same time and thus the TDD mode of amplifiers 600-1 and 600-2 is acceptable because the upstream and downstream signals are being sent using TDD.

Switched amplifiers 600 may be used in different types of systems that transmit signals upstream and downstream in the same frequency range.

FIG. 6A depicts an example of a dual switched amplifier 600-1 according to some embodiments. A master controller 601 controls operation of the system and dual switched amplifiers 600 within the system. In some embodiments, master controller 601 is included in network box 202. In some examples, a data transmission channel is bidirectional and operates in a frequency range of 1.2-1.8 GHz, but other types of data transmission channels may be appreciated.

The system uses a separate control transmission (bidirectional transmission or single directional) for transmission of control signals. In some examples, the control signal channels operate from a different frequency from which the data transmission uses, such as 1.0-1.01 GHz. In some examples, the control channels transmit data via Quadrature Phase Shift Keying (QPSK) modulated carriers in that band. In some embodiments, the system may use multiple control channels, each at a different frequency. One control channel is from the master controller to the amplifiers and the clients (downstream). In some examples, this control channel is arbitrarily placed at 1000 MHz. FIG. 6B depicts an example of control signals that are included at a lower frequency spectrum from the data transmission band 672 according to some embodiments. At 670, one or more control signals are included at a frequency lower than the data transmission band.

The control signals may also be included at higher frequencies. Each client has a control channel associated with it (upstream), placed at a frequency close to the downstream channel. FIG. 6C depicts an example of control signals that are included at a higher frequency spectrum from the data transmission band 672 according to some embodiments. At the portion of the frequency spectrum 674, one or more control signals are included at a frequency higher than the data transmission band 672. The channel spacing may be determined by circuit trade-offs, such as the complexity of any channel selection filters that might be used within the RF receivers and demodulators found in the master controllers, clients, and the amplifiers. Optionally, additional upstream control channels may be used within the amplifiers to allow for more sophisticated remote control of the amplifier operation and performance telemetry transmission back to the master controller 601.

Both the data transmission channel and the control signal channels follow the same transmission path, whether it is coaxial cable or other transmission links. The control signal channels are located outside the frequency range of the data transmission channel. This minimizes interference to the data transmission channel and allows for minimal interference of the data transmission channel to the control channels.

In some embodiments, there are multiple control channels used, each at a different frequency. There is a control channel from master controller 601 to amplifiers 600 and the clients 110. In this example, this control channel is arbitrarily placed at 1000 MHz Each client has a control channel associated with it (upstream), placed at a frequency close to the downstream channel. The actual channel spacing is determined by circuit trade-offs, such as the complexity of any channel selection filters that might be used within the RF receivers and demodulators found in the master controllers 601, clients 110, and the amplifiers 600. Optionally, additional upstream control channels may be used within the amplifiers 600 to allow for more sophisticated remote control of the amplifier operation and performance telemetry transmission back to the master controller 601.

Referring again to FIG. 6A, at each dual switched amplifier 600-1, the amplification (e.g., RF amplification) uses an amplification system that includes a pair of amplifiers 606 and 608 that are connected in opposite directions with respect to their inputs and outputs, but other amplifier configurations may be used. For example, the control signal configuration may be used with a single amplifier system discussed in FIG. 6D. Switches 604 and 608 are used to connect either one amplifier through a first path or the other amplifier through a second path based on a command from the master controller 601 or the client 601. This allows for bi-directional transmission and amplification using a single transmission link by using time division multiplexing. The amplifier "direction" is controlled by the master controller 601 and client 601 so that the upstream and downstream transmission traffic is properly synchronized and does not conflict. The use of switches 604 and 608 also minimizes any feedback possibilities between amplifiers 600 in the system that could potentially degrade RF performance. Other embodiments employ additional switches so that a single amplifier module can be switched between the upstream and downstream directions, reducing power consumption and cost as will be discussed below.

In addition to dual switched amplifiers 600 being bi-directional in signal transmission, it is operationally desirable for the actual dual switched amplifier 600-1 to be symmetric with respect to orientation at installation. The examples assume symmetric dual switched amplifiers 600 and will be described as such in operation, but symmetric amplifiers are not required.

Directional couplers 602-1 and 602-2 at the input/output ports of the amplifier 600 sample the incoming channels from both directions. Additionally, when the optional control signal transmitters 614-1 and 614-2 are used to transmit additional control and telemetry signals to the master controller 601, these control signals are coupled into the main transmission line through these same directional couplers 602-1 and 602-2.

RF receiver and demodulators 618-1 and 618-2 select the control signal channels from the transmission that includes the control signal and data transmission signal, and optionally using bandpass filters 616-1 and 616-2, respectively, to filter the transmission for the control signal band. RF receiver and demodulators 618-1 and 618-2 may also recover any datasets sent from the master controller or client interpretation and execution by the local control system. The dataset may be sending a change direction time, duration of the change, or a request for diagnostic information or other information, etc.

Once dual switched amplifiers 600-1 are installed into the system and the system is powered on, one initial action is for the master controller 601 to send out its control signal. The RF receivers 618-1 in each dual switched amplifier 600-1 detect which amplifier port the control signal is arriving from. Local control system 612 saves the port for later operation.

Once the downstream direction is established, dual switched amplifiers 600 are set to operate in the downstream direction. This allows control signals from master controller 601 to be sent to all clients 110. Master controller 601 polls clients 110, which respond in random time delayed fashion to minimize transmission contention on an upstream control signal channel that is pre-programmed into the client. Once each client 601 sends a unique identifier (ID), such as the unique manufacturing code in each client, back to master controller 601, master controller 601 then assigns a unique upstream control signal channel frequency to each client 601 along with an ID. Once a client 601 or dual switched amplifier 600-1 receives the ID and control signal channel frequency, it stops requesting responses. This allows for contention free communication in the upstream direction once initiation is complete. A similar approach can be used for later maintenance unit replacement or for expansion. In a similar fashion, each dual switched amplifier 600-1 that has the optional control signal transmitter 614 is assigned an ID and control signal channel frequency.

Once initialized, in operation, a local control system 612 detects control signals from the master controller 601 and client 601 that indicate which direction dual switched amplifier 600-1 should receive data transmission signals from and send data transmission signals. Local control system 612 then applies appropriate switch control signals to the RF switches 604 and 608 to attain that state. For example, local control system 612 may control switches 604 and 608 to couple the upstream signal to the upstream path and the downstream signal to the downstream path. For example, local control system 612 controls switches 604 and 608 based on whether a signal is being sent downstream or upstream. When local control system 612 detects the downstream signal is being sent, local control system 612 controls switches 604 and 608 to couple the downstream signal to amplifier 606 through a first path. Similarly, when local control system 612 detects an upstream signal is being sent, local control system 612 controls switches 604 and 608 to couple the upstream signal to amplifier 610 through a second path.

In the downstream direction, master controller 601 sends a control signal to each dual switched amplifier 600-1 and client 601 signifying that it is going to send downstream data transmission. Dual switched amplifier 600-1 may receive a downstream signal at a directional coupler 602. RF receiver and demodulator 618-1 in conjunction with local control system 612 in the first dual switched amplifier 600-1 downstream senses the presence of the detected control signal and then sets the RF switches 604 and 608 to allow downstream transmission, if they are not already in that mode. Directional coupler 602 can then send the downstream signal to switch 604. This allows for the amplifier 606 and 608 within dual switched amplifier 600-1 to increase the amplitude of the downstream data transmission and control signals to a suitable level for overcoming the insertion loss of the transmission line (e.g., power line). If there is more than one dual switched amplifier 600-1 between the master controller and the client 601, each will sense the control signal and will respond the same as the first downstream dual switched amplifier 600-1. This provides for a continuous transmission path from the master controller location to the client location through repeaters 402 and power cables 114.

In order to account for delays in the detection of the control signal and the RF switch operation, a delay period may be built into the data transmission initiation. Although this introduces some latency to the data transmission, it prevents loss of data transmission signal due to switching.

In the upstream direction, dual switched amplifier 600-1 may receive an upstream signal at a directional coupler 602-2, such as a signal sent from client 601. Directional coupler 602-2 can then send the upstream signal to local control system 612. Local control system 612 controls switch 608 to couple the upstream signal to amplifier 610. Amplifier 610 then amplifies the signal. Local control system 612 also controls switch 608 to then couple the upstream signal to directional coupler 602-1. Directional coupler 602-1 then sends the upstream signal in the upstream direction towards the master controller 601.

Other embodiments may include sending timing data with the control signals to minimize the time needed for the delay between upstream and downstream transmission. Additionally, the optional control signal transmitters 614 within each dual switched amplifier 600-1 can be used in conjunction with this timing data to eliminate the associated delay caused by waiting for one dual switched amplifier 600-1 to switch prior to the next dual switched amplifier 600-1 (or amplifiers) switching. In this case, the control signal transmission path essentially becomes parallel to the data transmission path and functions outside of any dual switched amplifier RF switching. That is, control signal transmitters 614 can transmit the control signals for other dual switched amplifiers 600-1 while processing the downstream transmission. Other enhancements may include remote amplifier performance monitoring, configuration, and system performance parameters.

In the above configuration, two different amplifiers and paths are used to amplify the downstream signals and the upstream signals, respectively. This uses multiple amplifiers 606 and 608, but only two switches 604 and 610, which may simplify the switching logic. The upstream and downstream paths are isolated by TDD in this example.

FIG. 6D depicts an example of a bi-directional switched amplifier 600-2 according to some embodiments. In bi-directional switched amplifier 600-2, the same amplifier 625 is used for both the upstream and downstream amplification, and switch poles are alternated to half duplex the upstream and downstream signals to amplifier 625. The upstream and downstream signal paths may share components other than amplifier 625. However, the overall path that is taken is different between the upstream and downstream. That is, the upstream path takes different circulator port rotations and switch poles through a first path, compared to a different second path for the downstream path.

A local detection and decision circuit changes the switch poles for each half duplex time slot in which signals are being sent upstream or downstream. In one example, the local detection and decision circuit detects when signal power is present at either upstream or downstream inputs (e.g., input P2 or input P1). When signal power is detected at input P2, the local detection and decision circuit changes the switch poles to connect input P2 to the input of amplifier 625, and output P1 to the output of amplifier 625. Similarly, as another example, when signal power is detected at input P1, the local detection and decision circuit changes the switch poles to connect input P1 to the input of amplifier 625, and output P2 to the output of amplifier 625. Different and additional coupling locations, and coupling directions, for the detection of signal power for local switching decision may be appreciated. Described herein is one embodiment of the bi-directional switched amplifier 600-2, with logic gate switch control decisions made from signal power detections of the upstream signal. Other embodiments not described herein include signal power detections of the downstream signal, and signal power detections on both upstream and downstream signals, for local switching decisions. Further, other variations on detecting the power at the inputs and performing the pole switching may be appreciated. Also, by not detecting power at that port may inherently detect power at the other port or the switching logic may be configured such that it is assumed power is detected at the other port. Further, the multiple amplifier system described in FIG. 6A may be use the local signal power detection to determine which of the first path and the second path to use in that embodiment.

In some embodiments, the bi-directional switched amplifier 600-2 receives an input signal at input P2 (e.g., the upstream direction). The input P2 signal is rotated clockwise by circulator 620 to the directional coupler 621. Circulators may be used to control the signal flow and can have three or more ports. The signal in a circulator follows a rotary path from one port to the next, always in the same rotational direction, clockwise, or counter-clockwise. The directional coupler 621 couples a small percentage of the input P2 signal to a filter 632 and detector 633. Filter 632 reduces the spurious signal levels outside of the signal bandwidth to prevent a false detection. The bandwidth of filter 632 may be narrower than the input P2 signal bandwidth to further prevent false detections. After detector 633 detects the input P2 signal, a logic 1 is output to the E input of an OR gate 636. A switch control table 642 shows that an input of E=1 at the OR gate 636 input causes the OR gate to output C=1, and each switch connected to the OR gate output (labeled with C), changes their switch pole to the C=1 state.

The large percentage of remaining input P2 signal at coupler 621 is rotated clockwise by circulator 622 and delayed by time delay 623. The period of delay is enough time for the switch poles to change to C=1 state, to prevent loss of input P2 signal. Until this point, the input P2 signal has followed a path independent of the switch pole state.

After the input P2 signal has passed through time delay 623, the local switch control logic has made the decision to change the switch poles to C=1, and switch 624 changes to connect the input P2 to the input of amplifier 625. The input P2 signal is amplified by amplifier 625, and the output at the C=1 pole of switch 626 is rotated clockwise by circulator 627 to directional coupler 628. Directional coupler 628 couples a small percentage of the amplified P2 signal to filter 634 and detector 635. Filter 634 reduces the spurious signal levels outside of the signal bandwidth to prevent a false detection. The bandwidth of filter 634 may be narrower than the P2 signal bandwidth to further prevent false detections. After detector 635 detects the amplified P2 signal, a logic 1 is output to the B input of the OR gate 636. Referring to switch control table 642, a detection of B=1 makes the OR gate output C=1, so the poles of the switches will not change from C=1 state while a signal is detected by detector 635, or detector 633 (C=B+E).

The large percentage of remaining amplified P2 signal at coupler 628 is rotated clockwise by circulator 629 to the P1 output of the bi-directional switched amplifier 600-2.

Also, any reflected signal along the path from input P2 to output P1, due to impedance discontinuity, gets rotated clockwise by circulators 620, 631, 622, 627, 629, and 630, where the reflected signals are absorbed by loads 649, 650, 648, 652, 653, 654, and the output of amplifier 625. If switches 626, 624 are non-reflective open (e.g., internally terminated when open), or reflective short (e.g., shorted to common reference potential when open), then switches 638, 639, and their loads 650, 654, can be deleted. If switches 626, 624 are reflective open, (e.g., high impedance discontinuity when open), then switches 638, 639, and their loads 650, 654, can be used. The reflected signals absorbed by loads 649, 650, 648, 652, 653, 654, and the output of amplifier 625, will provide low reflections at the P2 input, and P1 output.

After the upstream signal is no longer applied at the input P2, detector 633 and then detector 635 will detect no signal. From table 642, when the output of detector 633 is E=0, and then output of detector 635 is B=0, and both are applied at the inputs of OR Gate 636, the switch poles change to their C=0 state. With the switches in C=0 pole state, an input signal applied at port P1 in the downstream direction will be amplified by amplifier 625.

When an input P1 receives an input signal in the downstream direction, the input P1 signal is rotated clockwise by circulator 629 to circulator 630. Circulator 630 rotates the input P1 signal clockwise to switch 624. The signal at switch 624 is at the C=0 pole and is amplified by amplifier 625, and the output at switch 626 is the C=0 pole and is rotated by circulator 631 to circulator 620. The circulator 620 rotates the amplified P1 signal to the output P2 of the bi-directional switched amplifier 600-2.

Also, any reflected signal along the path from input P1 to output P2, due to impedance discontinuity, gets rotated clockwise by circulators 620, 631, 622, 627, 629, and 630, where the reflected signals are absorbed by loads 649, 651, 648, 652, 653, 655, and the output of amplifier 625. If switches 626, 624 are non-reflective open (e.g., internally terminated when open), or reflective short (e.g., shorted to common reference potential when open), then switches 640, 641, and their loads 651, 655, can be deleted. If switches 626, 624 are reflective open, (e.g., high impedance discontinuity when open), then switches 640, 641, and their loads 651, 655, can be used. The reflected signal absorbed by loads 649, 651, 648, 652, 653, 655, and the output of amplifier 625, will provide low reflections at the P1 input and P2 output.

The circulators 622, 627, 630, 631 may be eliminated from the bi-directional switched amplifier 600-2 depicted in FIG. 6D without changing the embodiment of the bi-directional switched amplifier 600-2. Eliminating circulators 622, 627, 630, 631, and retaining circulators 620, 629 in the bi-directional switched amplifier 600-2 may reduce cost and insertion loss. The eliminated circulators 622, 627, 630, 631 may be included in the bi-directional switched amplifier 600-2 to reduce reflections at P1 and P2.

Gain control loops can be used for amplifier 625 to control the output signal level. An example automated gain control loop is shown in bi-directional switched amplifier 600-2 by using detector 647, operational amplifier 643, capacitor 645, and resistors 644, 646; however, other configurations may be appreciated, including configurations when using signal detection at input/output P1 and input/output P2 of the bi-directional switched amplifier.

Figure 7:
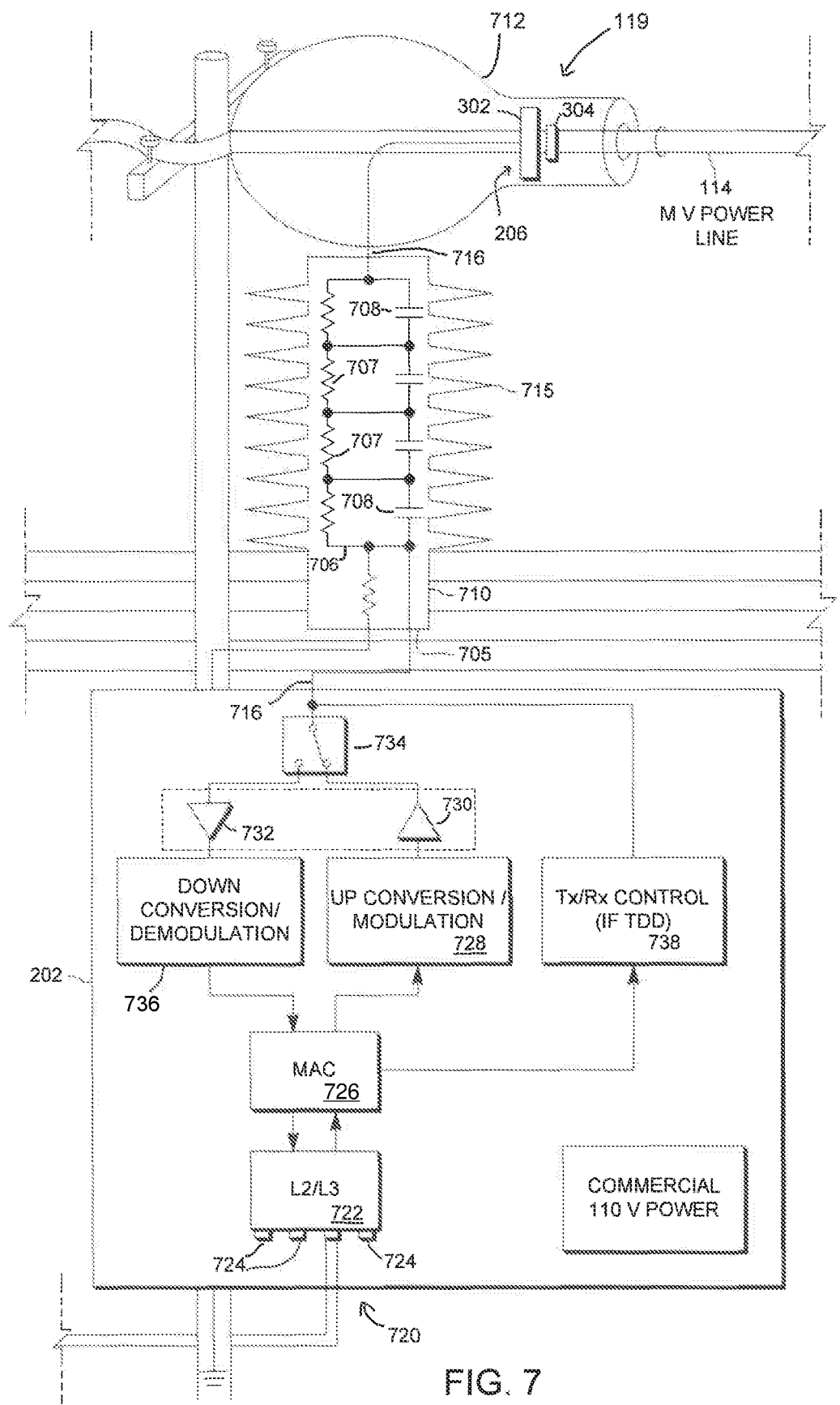
FIG. 7 shows an exemplary arrester.

FIG. 7 depicts a TM device 119 connected to a network unit 202 through an exemplary arrester 705, which preferably includes an RC network 706 comprising one or more resistors 707 and capacitors 708 surrounded by an insulating disc 710. In some embodiments, one or more signal paths between a TM wave transceiver 206 and a network unit 202 may pass through an arrester 705. The RC network 706 of arrester 705 preferably includes a series of resistors and capacitors arranged in a biasing ladder, thereby creating a path that reduces the higher voltage of the medium voltage power cable 114 to a lower voltage that is acceptable to the network unit 202. For example, the signal path created by the series of resistors and capacitors may be a high voltage protection path and a high frequency bypass. The series of resistors and capacitors may provide a signal path between the TM wave transceiver 206 and the network unit 202, and data signals may be passed between the TM wave transceiver 206 and network unit 202 along this signal path. In some embodiments, the arrester 705 may include a ground path to ground the series of resistors and capacitors. The insulating disc 710 may include one or more fins 715.

The TM device 119 is preferably fashioned as an outer, roughly egg-shaped absorptive Electromagnetic Interference (EMI) enclosure 712 that surrounds a surface wave launcher comprising a coupler 304 and reflector 302 as previously described. The EMI enclosure 712 may preferably define opposed openings by which the power line that provides the waveguide for transmitted signals may pass. A coaxial electrical connection 716 from the network unit 202 may pass through the arrestor 705 for connection to the surface wave launcher as previously described, i.e. the center conductor of the coaxial connection 716 connected to the coupler 304 and the shield conductor connected to the reflector 302.

In some embodiments, the network unit 202 may receive signals from, and transmit signals to, a network side interface 720 comprising an L2/L3 switch 722 having a plurality of ports 724, each port capable of propagating network signals, such as 5G, ENET, 10G-ENET, GPON, etc. Downstream signals, i.e. signals transmitted from a network to the TM device 119, are received from a respective port on the L2/L3 switch 722, directed to a MAC controller 726, and upconverted and modulated by module 728. The upconverted and modulated signal is then optionally amplified by amplifier 730 and routed onto coaxial connection 716 to the arrester 305 through transmit/receive switch 734. Conversely, upstream signals, i.e. signals transmitted from a network to the TM device 119, are received through transmit/receive switch 734 and optionally amplified by amplifier 732. The optionally-amplified signal is then demodulated and down-converted at module 736, sent to MAC controller 726 and output onto the network interface 720 via L2/L3 switch 724. If the network unit 202 transmits and receives time-division duplexed (TDD) signals, the MAC controller 726 may operate a transmit/receive controller 738. The network unit 202 preferably operated using commercial 110 volt power.

Figure 8:
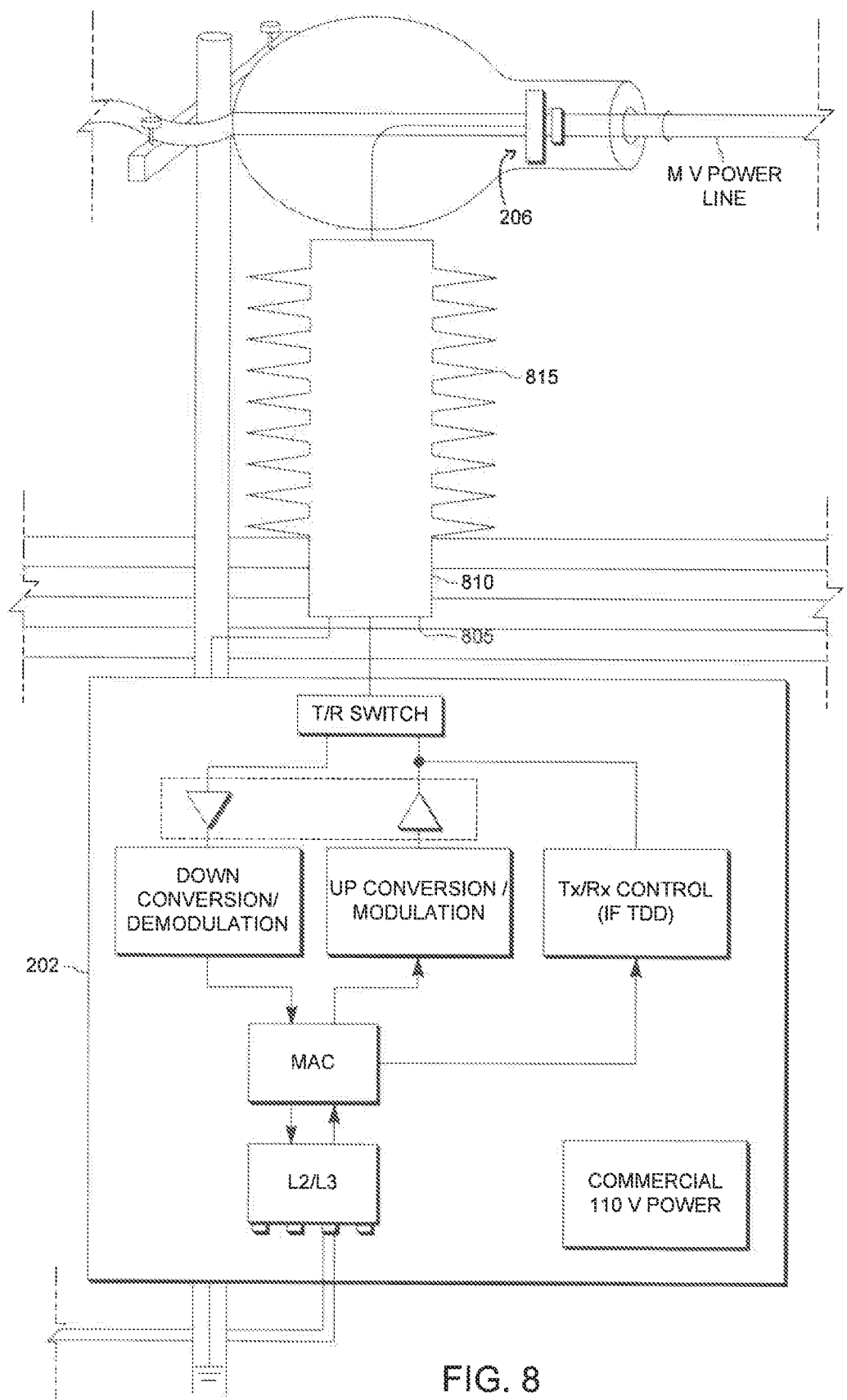
FIG. 8 shows an exemplary arrester that includes one or more metal oxide varistors (MOV).

FIG. 8 shows an exemplary arrester 805 that includes one or more MOVs (metal oxide varistors). In some embodiments, one or more signal paths between a TM wave transceiver 206 and a network unit 202 may pass through the arrester 805. The arrester 805 may include one or more signal paths that pass through a material or circuitry through which an RF signal may be passed while withstanding high voltage and providing a low impedance path to low frequencies. For example, the arrester 805 may include one or more signal paths comprising MOVs (metal oxide varistors). The MOVs may include gapped or un-gapped MOVs. Each MOV may include one or more MOV discs, wherein the number of MOV discs included in each MOV is based upon a desired impedance.

An MOV may include granules having a capacitive connection between them, and when the voltage potential across the plates of the MOV reaches a certain value, the voltage has enough potential energy to jump over the gaps between granules. Once voltage is high enough, the voltage may cross the MOV and may be passed to ground. The one or more signal paths of the arrester 805 may be encompassed by an external body 810. The external body 810 may include one or more fins 815.

Figure 9A:
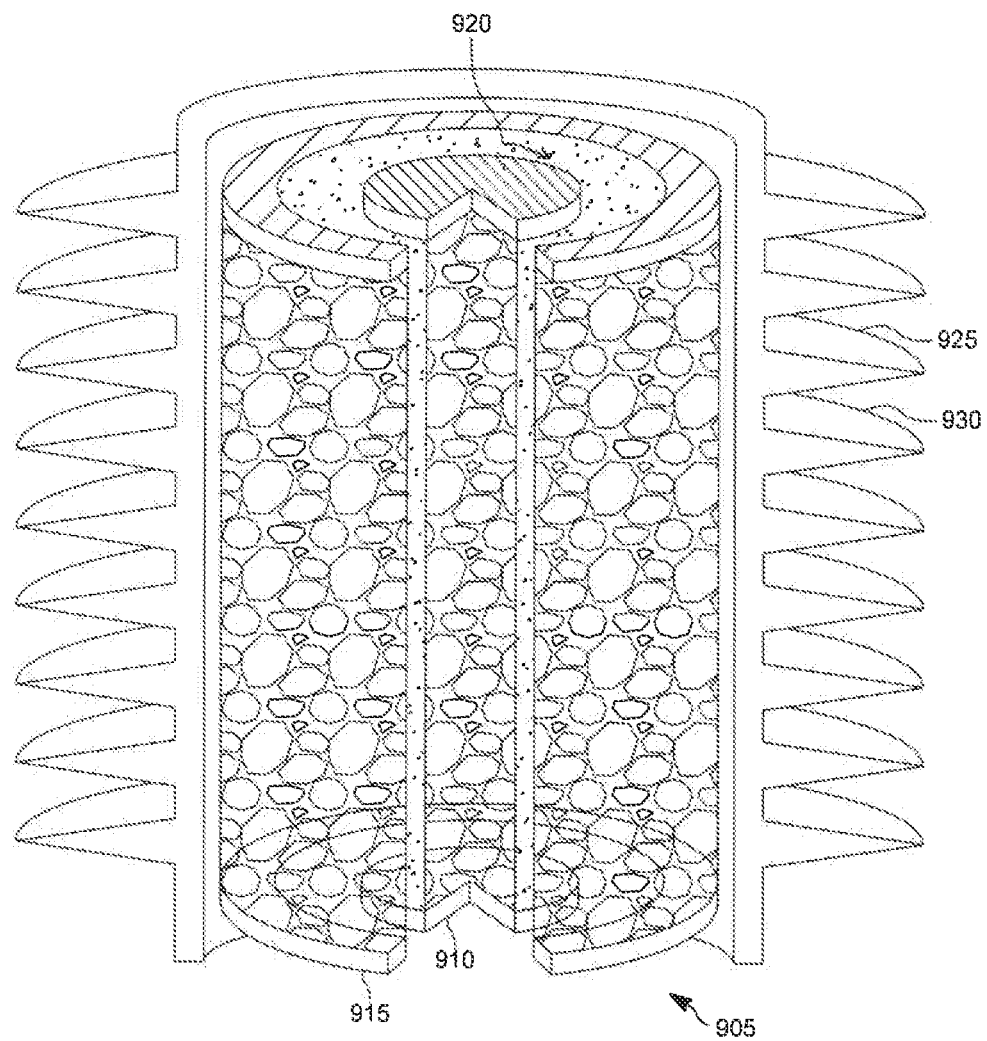
FIG. 9A shows an exemplary arrester that includes two or more concentric MOVs.

FIG. 9A depicts an exemplary arrester 905 that includes two or more concentric MOVs, thereby creating a coaxial connection between a transceiver (e.g., TM wave transceiver 206 of FIG. 2) and a network box (e.g., network unit 202 of FIG. 2). Each respective one of the two or more concentric MOVs may provide a signal path between the transceiver and the network box. For example, a central or inner MOV 910 may provide a signal path for a coupler (e.g., coupler 304 of FIG. 3), and an outer MOV 915 may provide a signal path for a reflector (e.g., reflector 302 of FIG. 3). The central or inner MOV 910 may be shaped as a cylinder. The outer MOV 915 may be shaped as a hollow cylinder (i.e., a cylinder having a hollow portion), wherein the central or inner MOV 910 is placed within the hollow portion of the outer MOV 915.

In some embodiments, data signals may be passed along at least one of the one or more signal paths. In some embodiments, the arrester 905 may have a coaxial connector (e.g., coaxial RF connector) at both ends. The signal path created by the inner MOV 910 may be routed through a coaxial connector to a center conductor (i.e., interior portion) of a coaxial cable, and the signal path created by the outer MOV 915 may be routed through a coaxial connector to a shield (i.e., outer portion) of the coaxial cable.

The concentric MOVs may preferably be separated from each other by an insulator 920, thereby separating the different signal paths. For example, a gap between the central or inner MOV 910 and the outer MOV 915 may be filled with an insulator 920. In some embodiments, the insulator 920 may be a hollow cylinder that is placed between the central or inner MOV 910 and the outer MOV 915. The two or more concentric MOVs may be encompassed by an external body 925. The external body 925 may include one or more fins 930. While the two or more MOVs are shown in FIG. 9A as being concentric, it should be understood that the MOVs may be configured as coplanar, twisted pairs, or other configurations.

Figure 9B:
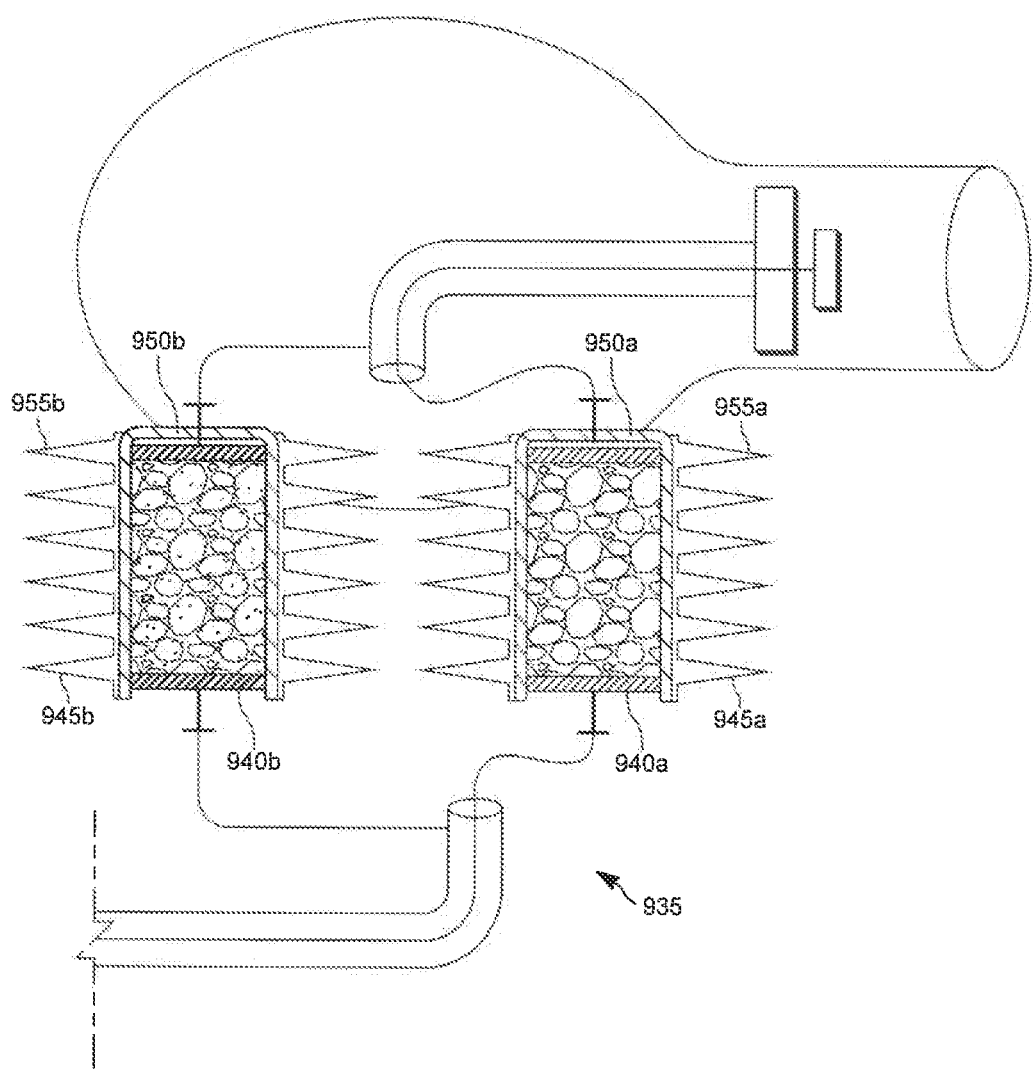
FIG. 9B shows an exemplary arrester that includes two or more MOVs enclosed by separate external bodies.

FIG. 9B shows an alternative exemplary arrester 935 that includes two or more MOVs 940a, 940b that are each enclosed by separate respective external bodies 945a and 945b, thereby creating multiple signal paths between a transceiver (e.g., TM wave transceiver 206 of FIG. 2) and a network box (e.g., network unit 202 of FIG. 2). Each respective one of the two or more MOVs 940a, 940b may provide a signal path between the transceiver and the network box. Each of the two or more MOVs 940a, 940b may be positioned beside each other, and the MOVs 940a, 940b may be separated from each other by an insulator 950a, 950b. For example, each of the MOVs 940a, 940b may be encompassed by an insulating material. A first MOV (e.g., MOV 940a) may provide a signal path for a coupler (e.g., coupler 304 of FIG. 3), and a second MOV (e.g., MOV 940b) may provide a signal path for a reflector (e.g., reflector 302 of FIG. 3). The MOVs 940a, 940b may be shaped as cylinders and may include one or more MOV discs. In some embodiments, data signals may be passed along at least one of the one or more signal paths.

A signal path created by a first MOV (e.g., MOV 940a) may be routed through a first terminal that is connected to a center conductor (i.e., interior portion) of a coaxial cable passing between the arrester 935 and the transceiver and through a second terminal that is connected to a center conductor (i.e., interior portion) of a coaxial cable passing between the arrester 935 and the network box. A signal path created by a second MOV (e.g., MOV 940b) may be routed through a first terminal that is connected to a shield (i.e., outer portion) of a coaxial cable passing between the arrester 935 and the transceiver and through a second terminal that is connected to a shield (i.e., outer portion) of a coaxial cable passing between the arrester 935 and the network box.

Each respective one MOV of the two or more MOVs 940a, 940b may be encompassed by an external body 945a, 945b dedicated for enclosing the respective one MOV. Therefore, the arrester 935 may comprise multiple external bodies 945a, 945b (i.e., an external body for each MOV) and each respective one MOV of the one or more MOVs 940a, 940b may be separated from one or more other MOVs by an insulator 950a, 950b and an external body 945a, 945b. Each external body 945a, 945b may include one or more fins 955a, 955b.

Figure 9C:
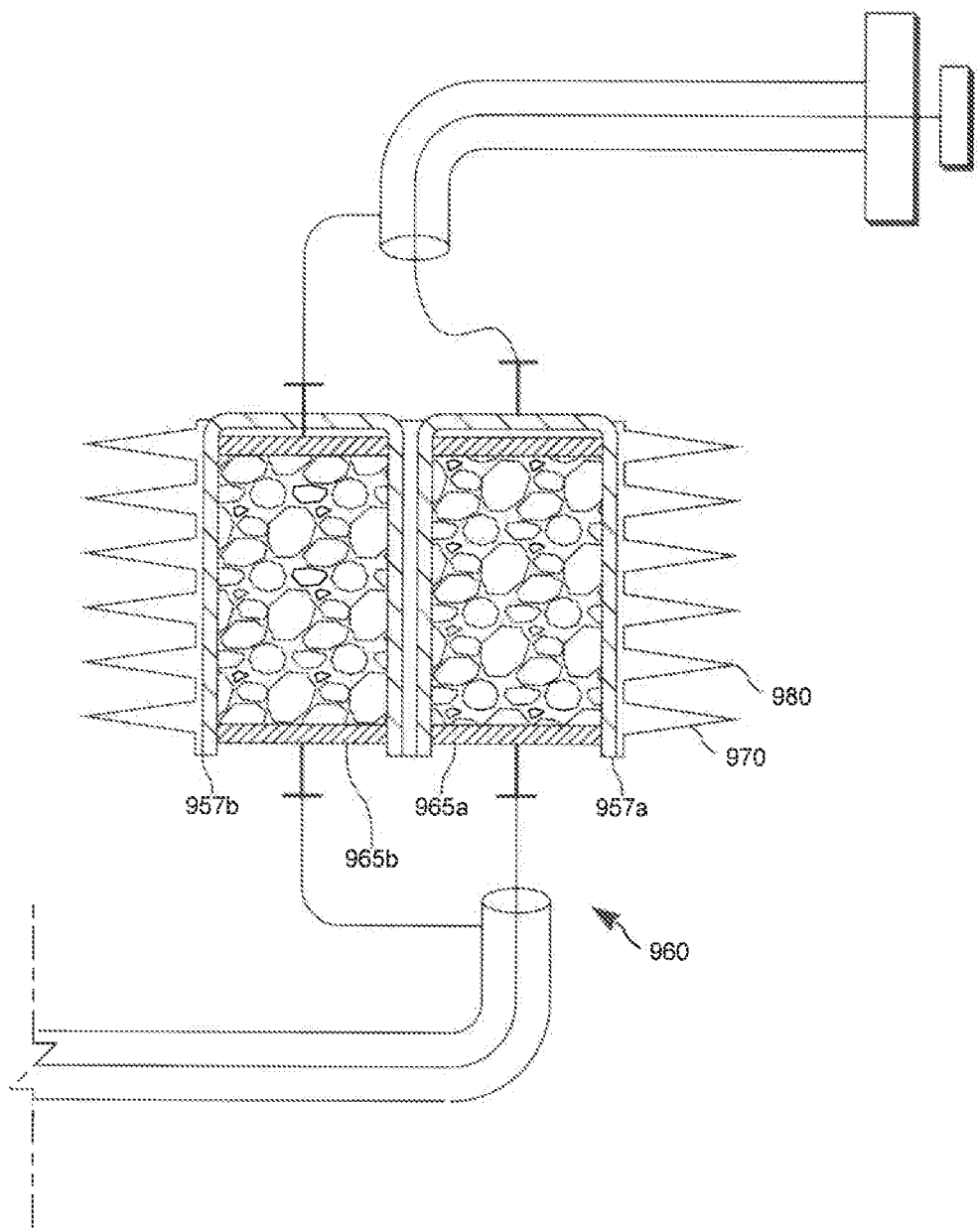
FIG. 9C shows an exemplary arrester that includes two or more MOVs enclosed by the same external body.

FIG. 9C shows an alternative exemplary arrester 960 that includes two or more MOVs 965a, 965b that are enclosed by the same external body 970, thereby creating multiple signal paths between a transceiver (e.g., TM wave transceiver 206 of FIG. 2) and a network box (e.g., network unit 202 of FIG. 2). Each respective one of the two or more MOVs 965a, 965b may provide a signal path between the transceiver and the network box. Each of the two or more MOVs 965a, 965b may be positioned beside each other, and the MOVs 965a, 965b may be separated from each other by a respective insulator 975a, 975b. For example, each of the MOVs 965a, 965b may be encompassed by an insulating material. A first MOV (e.g., MOV 965a) may provide a signal path for a coupler (e.g., coupler 304 of FIG. 3), and a second MOV (e.g., MOV 965b) may provide a signal path for a reflector (e.g., reflector 302 of FIG. 3). The MOVs 965a, 965b may be shaped as cylinders and may include one or more MOV discs.

In some embodiments, data signals may be passed along at least one of the one or more signal paths. A signal path created by a first MOV (e.g., MOV 965a) may be routed through a first terminal that is connected to a center conductor (i.e., interior portion) of a coaxial cable passing between the arrester 960 and the transceiver and through a second terminal that is connected to a center conductor (i.e., interior portion) of a coaxial cable passing between the arrester 960 and the network box. A signal path created by a second MOV (e.g., MOV 965b) may be routed through a first terminal that is connected to a shield (i.e., outer portion) of a coaxial cable passing between the arrester 960 and the transceiver and through a second terminal that is connected to a shield (i.e., outer portion) of a coaxial cable passing between the arrester 960 and the network box.

All of the two or more MOVs 965a, 965b may be encompassed by a single external body 970. Therefore, the arrester 960 may include a single external body 970 encompassing all of the MOVs 965a, 965b. The external body 970 may include one or more fins 980.

Those of ordinary skill in the art will appreciate that the arrestors described herein may be mounted to a pole or directly to a launcher enclosure.

While the various arrester embodiments disclosed herein show two signal paths, it should be understood that the arresters may include more than two signal paths. The various arrester embodiments described herein may comprise more than two signal paths (e.g., more than two MOVs). For example, four concentric MOVs or eight separate MOVs may be utilized to support signal paths through four coaxial connectors (e.g., in support of 4G communications).

While signal paths for RF signals are described herein, it should be understood that the signal paths provided by the various arrester embodiments may be utilized to pass signals to and from antenna situated above a network box (e.g., situated on top of a power pole).

Figure 10:
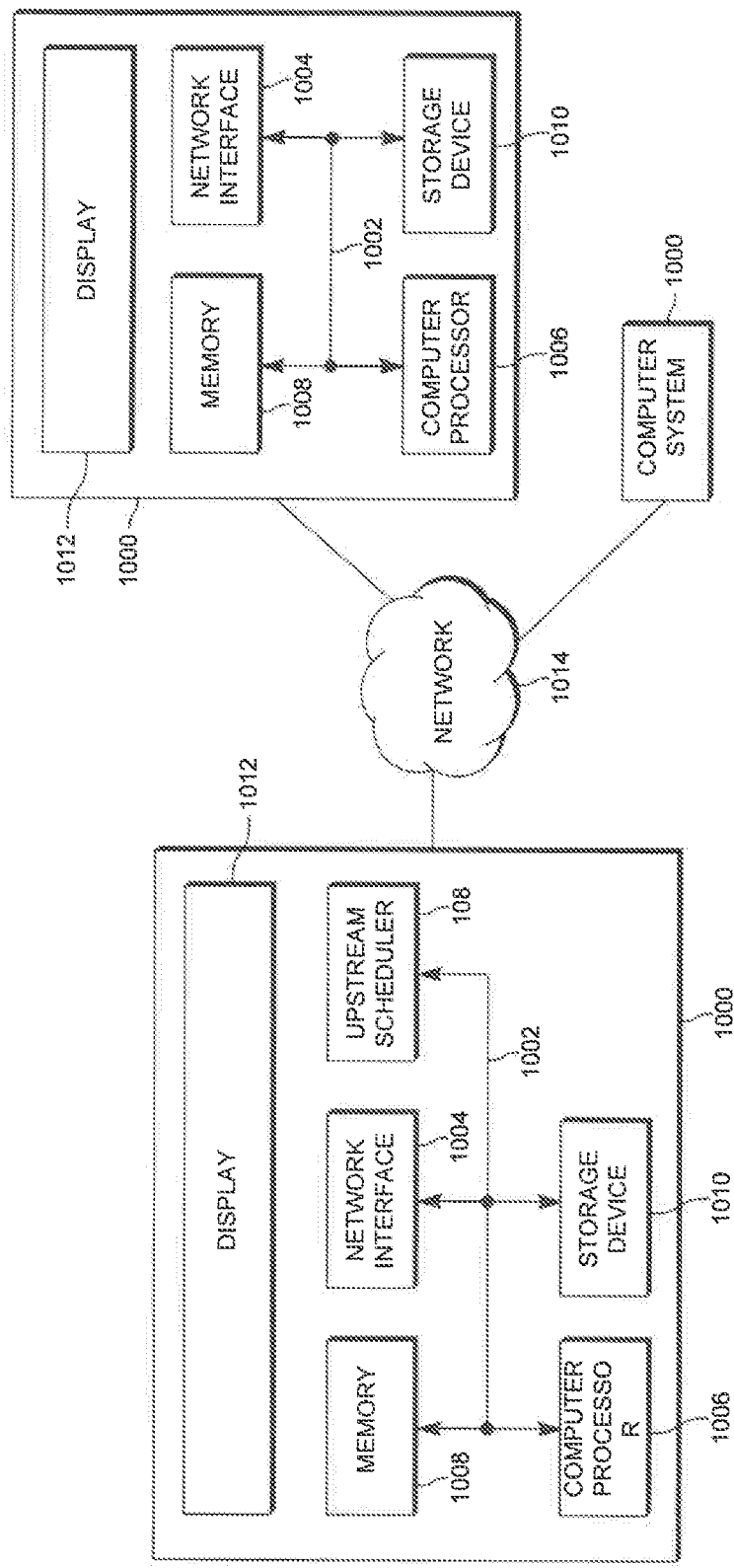
FIG. 10 shows an exemplary special-purpose computer system configured with a switched amplifier according to one embodiment.

FIG. 10 illustrates an example of special purpose computer systems 1000 configured with a switched amplifier 600 according to one embodiment. Computer system 1000 includes a bus 1002, network interface 1004, a computer processor 1006, a memory 1008, a storage device 1010, and a display 1012.

Bus 1002 may be a communication mechanism for communicating information. Computer processor 1006 may execute computer programs stored in memory 1008 or storage device 1008. Any suitable programming language can be used to implement the routines of some embodiments including C, C++, Java, assembly language, etc. Different programming techniques can be employed such as procedural or object oriented. The routines can execute on a single computer system 1000 or multiple computer systems 1000. Further, multiple computer processors 1006 may be used.

Memory 1008 may store instructions, such as source code or binary code, for performing the techniques described above. Memory 1008 may also be used for storing variables or other intermediate information during execution of instructions to be executed by processor 1006. Examples of memory 1008 include random access memory (RAM), read only memory (ROM), or both.

Storage device 1010 may also store instructions, such as source code or binary code, for performing the techniques described above. Storage device 1010 may additionally store data used and manipulated by computer processor 1006. For example, storage device 1010 may be a database that is accessed by computer system 1000. Other examples of storage device 1010 include random access memory (RAM), read only memory (ROM), a hard drive, a magnetic disk, an optical disk, a CD-ROM, a DVD, a flash memory, a USB memory card, or any other medium from which a computer can read.

Memory 1008 or storage device 1010 may be an example of a non-transitory computer-readable storage medium for use by or in connection with computer system 1000. The non-transitory computer-readable storage medium contains instructions for controlling a computer system 1000 to be configured to perform functions described by some embodiments. The instructions, when executed by one or more computer processors 1006, may be configured to perform that which is described in some embodiments.

Computer system 1000 includes a display 1012 for displaying information to a computer user. Display 1012 may display a user interface used by a user to interact with computer system 1000.

Computer system 1000 also includes a network interface 1004 to provide data communication connection over a network, such as a local area network (LAN) or wide area network (WAN). Wireless networks may also be used. In any such implementation, network interface 1004 sends and receives electrical, electromagnetic, or optical signals that carry digital data streams representing various types of information.

Computer system 1000 can send and receive information through network interface 1004 across a network 1014, which may be an Intranet or the Internet. Computer system 1000 may interact with other computer systems 1000 through network 1014. In some examples, client-server communications occur through network 1014. Also, implementations of some embodiments may be distributed across computer systems 1000 through network 1014.

Some embodiments may be implemented in a non-transitory computer-readable storage medium for use by or in connection with the instruction execution system, apparatus, system, or machine. The computer-readable storage medium contains instructions for controlling a computer system to perform a method described by some embodiments. The computer system may include one or more computing devices. The instructions, when executed by one or more computer processors, may be configured to perform that which is described in some embodiments.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

The invention claimed is:

1. An arrester configured for interposition between a network unit that processes data communications signals and a surface wave launcher that surrounds a high power transmission line and launches the communication signals on, and receives the communications signals from the high power transmission line, the arrestor comprising first and second metal oxide varistors (MOVs) separated by an insulator and capable of preventing voltage from arcing from the power transmission line to the network unit, and also capable of propagating the communications signals between the network unit and the surface wave launcher, where the first MOV is connected to a center conductor of a coaxial interface and the second MOV is connected to a shield conductor of the coaxial interface.

2. The arrester of claim 1 comprising a biasing ladder of resistors and capacitors surrounded by insulating discs.

3. The arrester of claim 1 comprising a coaxial transmission line that propagates the communication signals.

4. The arrester of claim 1 where the MOV comprises one or more fins.

5. The arrester of claim 1 where the first MOV and the second MOV are concentric to each other.

6. The arrester of claim 1 where the first MOV and the second MOV are at least one of coplanar with each other or arranged in a twisted pair.

7. The arrester of claim 1 where the arrester is connected to the surface wave launcher, which includes a coupler and a reflector, and where the first MOV is connected to the coupler and the second MOV is connected to the reflector.

8. The arrester of claim 1 where the first MOV and the second MOV are encompassed by a single body.

9. The arrester of claim 1 where each of the first MOV and the second MOV has a respective external body.

10. The arrester of claim 9 where each of the external bodies includes at least one fin.

11. A device configured for interposition between a network unit that processes data communications signals and a surface wave launcher that surrounds a high power transmission line and launches the communication signals on, and receives the communications signals from the high power transmission line, the device including a first arrester and a second arrester separated by an insulator, each comprising an RC network of resistors and capacitors surrounded by an insulator, the at least one arrester preventing voltage from arcing from the power transmission line to the network unit, and also capable of propagating the communications signals between the network unit and the surface wave launcher, where the first arrester is connected to a center conductor of a coaxial interface and the second arrester is connected to a shield conductor of the coaxial interface.

12. The device of claim 11 where the network of resistors and capacitors forms a biasing ladder.

13. The device of claim 11 where each at least one arrester comprises a metal oxide varistor (MOV).

14. The device of claim 11 where each at least one arrester comprises a coaxial transmission path for the communications signals.

15. The device of claim 11 where the first arrester and the second arrester are concentric to each other.

16. The arrester of claim 11 where the first arrester and the second arrester are at least one of coplanar with each other or arranged in a twisted pair.

* * * * *